(12) United States Patent
Hong et al.

(10) Patent No.: US 7,859,931 B2
(45) Date of Patent: Dec. 28, 2010

(54) REFRESH PERIOD SIGNAL GENERATOR WITH DIGITAL TEMPERATURE INFORMATION GENERATION FUNCTION

(75) Inventors: Yun-Seok Hong, Ichon (KR); Ho-Uk Song, Ichon (KR)

(73) Assignee: Hynix Semiconductor Inc. (KR)

( * ) Notice: Subject to any disclaimer, the term of this patent is extended or adjusted under 35 U.S.C. 154(b) by 187 days.

(21) Appl. No.: 12/334,308

(22) Filed: Dec. 12, 2008

(65) Prior Publication Data

US 2009/0154279 A1 Jun. 18, 2009

Related U.S. Application Data

(63) Continuation-in-part of application No. 12/107,700, filed on Apr. 22, 2008, now Pat. No. 7,705,688, and a continuation-in-part of application No. 12/181,886, filed on Jul. 29, 2008.

(30) Foreign Application Priority Data

Dec. 14, 2007 (KR) ............. 10-2007-0130701
Apr. 24, 2008 (KR) ............. 10-2008-0038032

(51) Int. Cl.
G11C 7/00 (2006.01)
G11C 7/04 (2006.01)
H03B 1/00 (2006.01)

(52) U.S. Cl. .......... 365/222; 365/191; 331/49; 331/176

(58) Field of Classification Search ............... 365/191, 365/222, 233; 331/49, 74
See application file for complete search history.

(56) References Cited

U.S. PATENT DOCUMENTS

| | | | |
|---|---|---|---|
| 5,495,452 A * | 2/1996 | Cha | ............ 365/222 |
| 7,038,968 B2 | 5/2006 | Kim | |
| 7,120,549 B2 | 10/2006 | Lee | |
| 7,145,826 B2 | 12/2006 | Hong et al. | |
| 7,164,614 B2 | 1/2007 | Kim | |
| 7,266,031 B2 | 9/2007 | Kim et al. | |
| 7,272,063 B1 | 9/2007 | Egerer et al. | |
| 7,359,270 B2 | 4/2008 | Lee | |
| 2007/0274145 A1 | 11/2007 | Sohn | |

FOREIGN PATENT DOCUMENTS

| | | |
|---|---|---|
| JP | 01-205788 | 8/1989 |
| JP | 2003-132678 | 5/2003 |
| JP | 2005-222574 | 8/2005 |
| JP | 2006-114205 | 4/2006 |
| KR | 1020030050349 A | 6/2003 |
| KR | 1020030078705 | 10/2003 |
| KR | 1020070118359 A | 12/2007 |
| KR | 1020080003025 A | 1/2008 |
| KR | 1020080030358 A | 4/2008 |

* cited by examiner

*Primary Examiner*—David Mis
(74) *Attorney, Agent, or Firm*—Baker & McKenzie LLP

(57) ABSTRACT

A refresh period signal generator with a digital temperature information generation function includes a temperature information generating part configured to generate temperature information by using a first period signal and a second period signal, a refresh period signal generating part configured to output a refresh period signal by selecting one signal having a shorter period between the first period signal and the second period signal, and an operation timing control part operating the temperature information generating part and the refresh period signal generating part at a predetermined timing.

41 Claims, 17 Drawing Sheets

REFRESH PERIOD SIGNAL GENERATOR WITH DIGITAL TEMPERATURE INFORMATION GENERATION FUNCTION

CROSS-REFERENCES TO RELATED APPLICATION

The present application claims priority under 35 U.S.C. §119(a) to Korean application number 10-2007-0130701, filed on Dec. 14, 2007, Korean application number 10-2008-0038032, filed on Apr. 24, 2008, in the Korean Intellectual Property Office, and as a Continuation-In-Part under 35 U.S.C. §120 to U.S. application Ser. No. 12/107,700, filed on Apr. 22, 2008, and U.S. application Ser. No. 12/181,886, filed on Jul. 29, 2008 which are incorporated herein by reference in its entirety as set forth in full.

BACKGROUND

1. Technical Field

The embodiments described herein relate to a period signal generator, and more particularly, to a refresh period signal generator with a digital temperature information generation function.

2. Related Art

In general, a semiconductor memory device records data in a memory cell or outputs the data recorded in the memory cell to the an exterior of the semiconductor memory device. In addition, the semiconductor memory device has an operation mode called 'refresh' that should be essentially performed in order to prevent the data recorded in the memory cell from being lost. The refresh may be classified into a self refresh that is self-performed interior to the semiconductor memory device and an auto refresh that is performed according to a command exterior to the semiconductor memory device.

For example, the auto refresh is performed only in the case when the command is input from the exterior of the semiconductor memory device, while the self refresh is periodically performed in the interior of the semiconductor memory device. Accordingly, the semiconductor memory device requires a period signal for determining the timing of a self refresh operation. The period signal is called a refresh signal, and is generated and used in the semiconductor memory device.

A method for varying the period of the refresh signal depending on a surrounding temperature is adopted to improve the efficiency of the self refresh operation. For this, a device called a Temperature Compensated Self Refresh (TCSR) Oscillator is used.

FIG. 1 is a graph demonstrating a conventional temperature/period output of a self refresh signal. In FIG. 1, the TCSR oscillator generates a pulse signal by increasing the period of the pulse signal as a temperature decreases. The semiconductor memory device uses the generated pulse signal as the refresh signal. The TCSR oscillator enables the efficient self refresh operation by periodically varying the refresh signal.

However, as shown in FIG. 1, the TCSR oscillator generates a refresh signal having an excessively increased period at a predetermined temperature, for example 37° C. or lower (generally called a room temperature or a low temperature in a semiconductor circuit technology), thereby causing a serious error in which the self refresh operation itself is not performed.

The auto refresh operation also requires information on the temperature in the vicinity of the semiconductor memory device in order to use the method for varying the period of the auto refresh signal depending on the surrounding temperature. Refresh rate according to temperature information output through pads DQ8 to DQ10 of a DRAM is defined in the Joint Electron Device Engineering Council (JEDEC) specification relating to a mobile DRAM. However, up to now, hardware and software for providing the temperature information in the semiconductor integrated circuit (IC) have not yet developed.

SUMMARY

A refresh period signal generator with a digital temperature information generation function, which is capable of controlling the period of a refresh signal and outputting digital type temperature information to the outside of a semiconductor integrated circuit by generating the digital type temperature information for an efficient and stable refresh operation is described herein.

In one aspect, a refresh period signal generator with a digital temperature information generation function includes a temperature information generating part configured to generate temperature information by using a first period signal and a second period signal, a refresh period signal generating part configured to output a refresh period signal by selecting one signal having a shorter period between the first period signal and the second period signal, and an operation timing control part operating the temperature information generating part and the refresh period signal generating part at a predetermined timing.

In another aspect, a refresh period signal generator with a digital temperature information generation function includes a first period signal generating part that generates a first period signal having a period varying according to a temperature, a second period signal generating part that generates a second period signal having a predetermined period regardless of the temperature, a dividing part that outputs first to fourth dividing period signals by dividing the first period signal and the second period signal at a plurality of predetermined dividing ratios, a temperature information generating part that generates temperature information by using the first dividing period signal and the second period signal, a refresh period signal generating part that outputs a refresh period signal by selecting one signal having a shorter period between the third dividing period signal and the fourth dividing period signal, and an operation timing control part that operates the temperature information generating part and the refresh period signal generating part at different timings.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
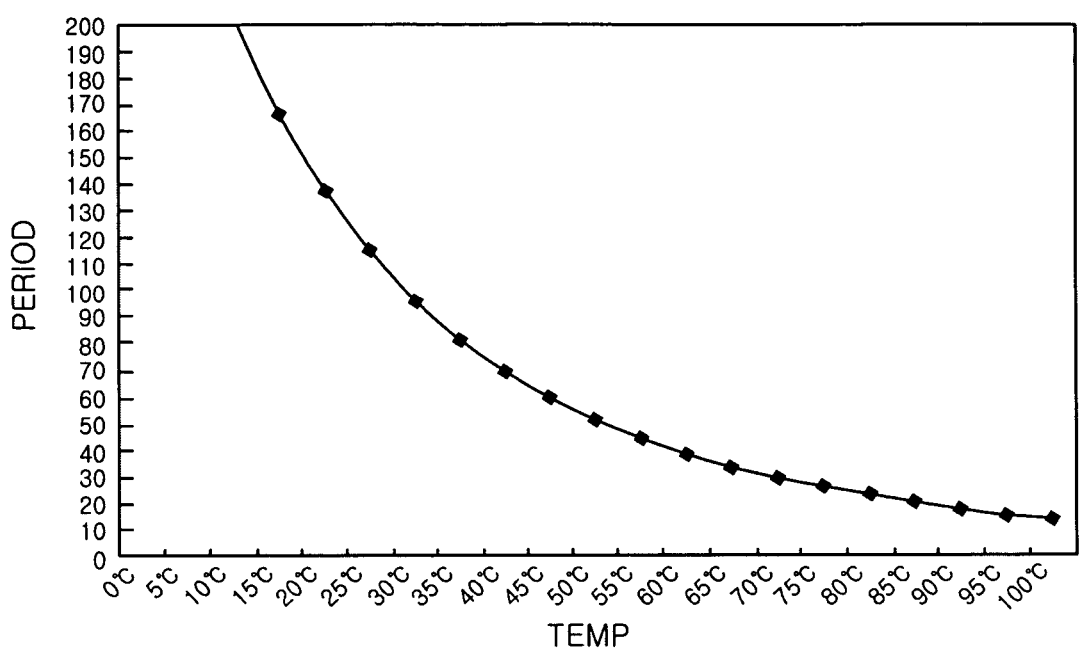
FIG. 1 is a graph demonstrating a conventional temperature/period output of a self refresh signal.
Figure 2:
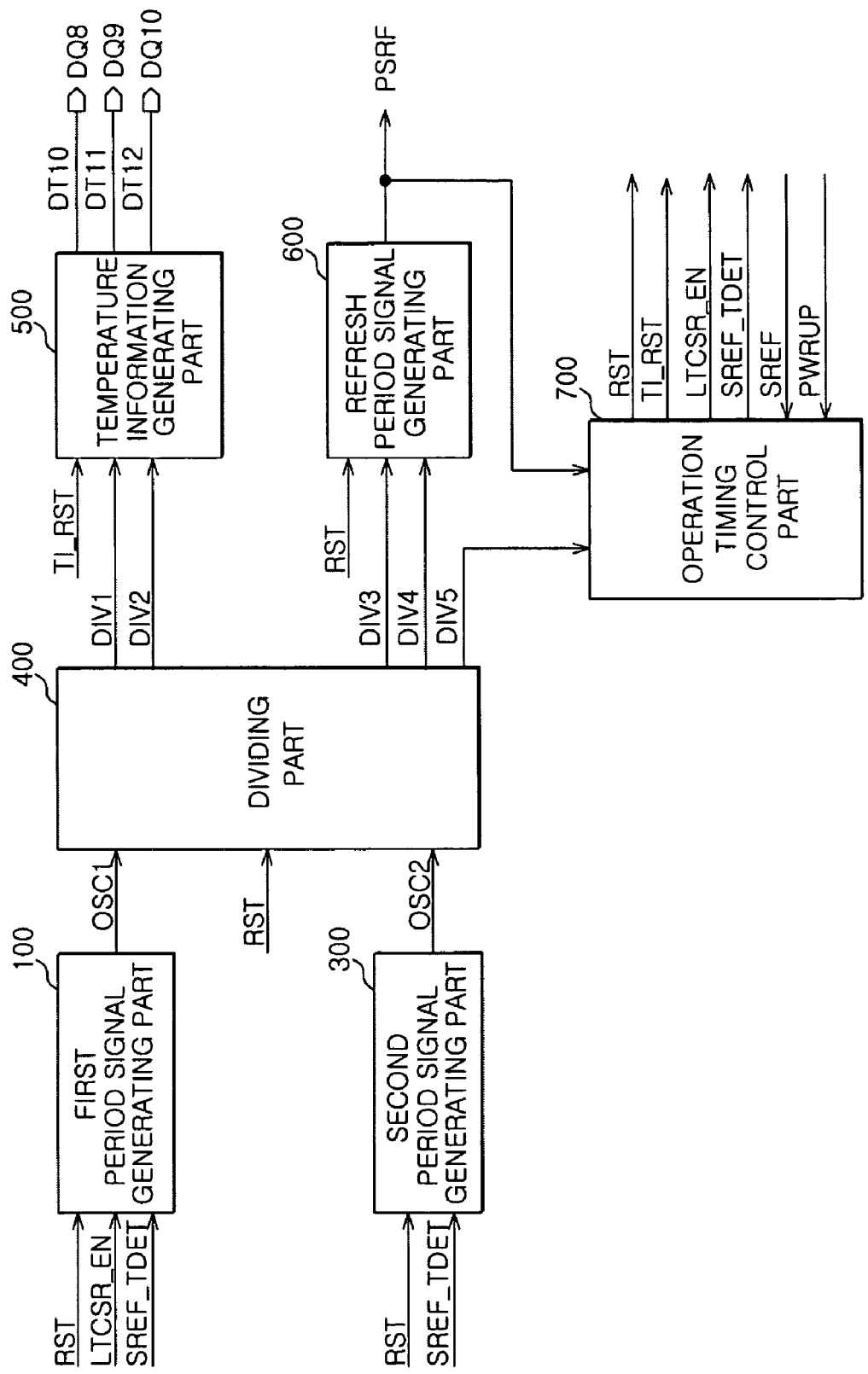
FIG. 2 is a schematic block diagram of an exemplary refresh period signal generator with a digital temperature information generation function according to one embodiment.

FIG. 2 is a schematic block diagram of an exemplary refresh period signal generator with a digital temperature information generation function according to one embodiment. In FIG. 2, the refresh period signal generator with the digital temperature information function can be configured to include a first period signal generating part 100, a second period signal generating part 300, a dividing part 400, a temperature information generating part 500, a refresh period signal generating part 600, and an operation timing control part 700.

The first period signal generating part 100 can be configured to generate a first period signal 'OSC1' of which the period varies depending on a temperature by receiving a first reset signal 'RST', an enable signal 'LTCSR_EN', and an operation section signal 'SERF_TDET'. Here, the first period signal generating part 100 may include a Temperature Compensated Self Refresh (TCSR) oscillator.

The second period signal generating part 300 can be configured to generate a second period signal 'OSC2' having a predetermined period regardless of the temperature by receiving the first reset signal 'RST' and the operation section signal 'SERF_TDET'. Here, the second period signal generating part 300 may include an Extended Mode Register Set (EMRS) oscillator.

The dividing part 400 can be configured to output first to fifth dividing period signals 'DIV1' to 'DIV5' by dividing the first period signal 'OSC1' and the second period signal 'OSC2' at any one dividing ratio selected from a plurality of predetermined dividing ratios, i.e., 2 divisions, 4 divisions, 8 divisions, . . . , 4096 divisions. The first dividing period signal 'DIV1' can be generated by dividing the first period signal 'OSC1'. For example, the first dividing period signal 'DIV1' may have a period of 40 μs. Similarly, the second dividing period signal 'DIV2' can be generated by dividing the second period signal 'OSC2'. For example, the second dividing period signal 'DIV2' may have a period of 160 μs. Likewise, the third dividing period signal 'DIV3' can be generated by dividing the first period signal 'OSC1'. For example, the third dividing period signal 'DIV3' may have a period of 20 μs. In addition, the fourth dividing period signal 'DIV4' can be generated by dividing the second period signal 'OSC2'. For example, the fourth dividing period signal 'DIV4' may have a period of 80 μs. Finally, the fifth dividing period signal 'DIV5' can be generated by dividing the second period signal 'OSC2' or the fourth dividing period signal 'DIV4'. For example, the fifth dividing period signal 'DIV5' may have a period of 320 μs.

Figure 3:
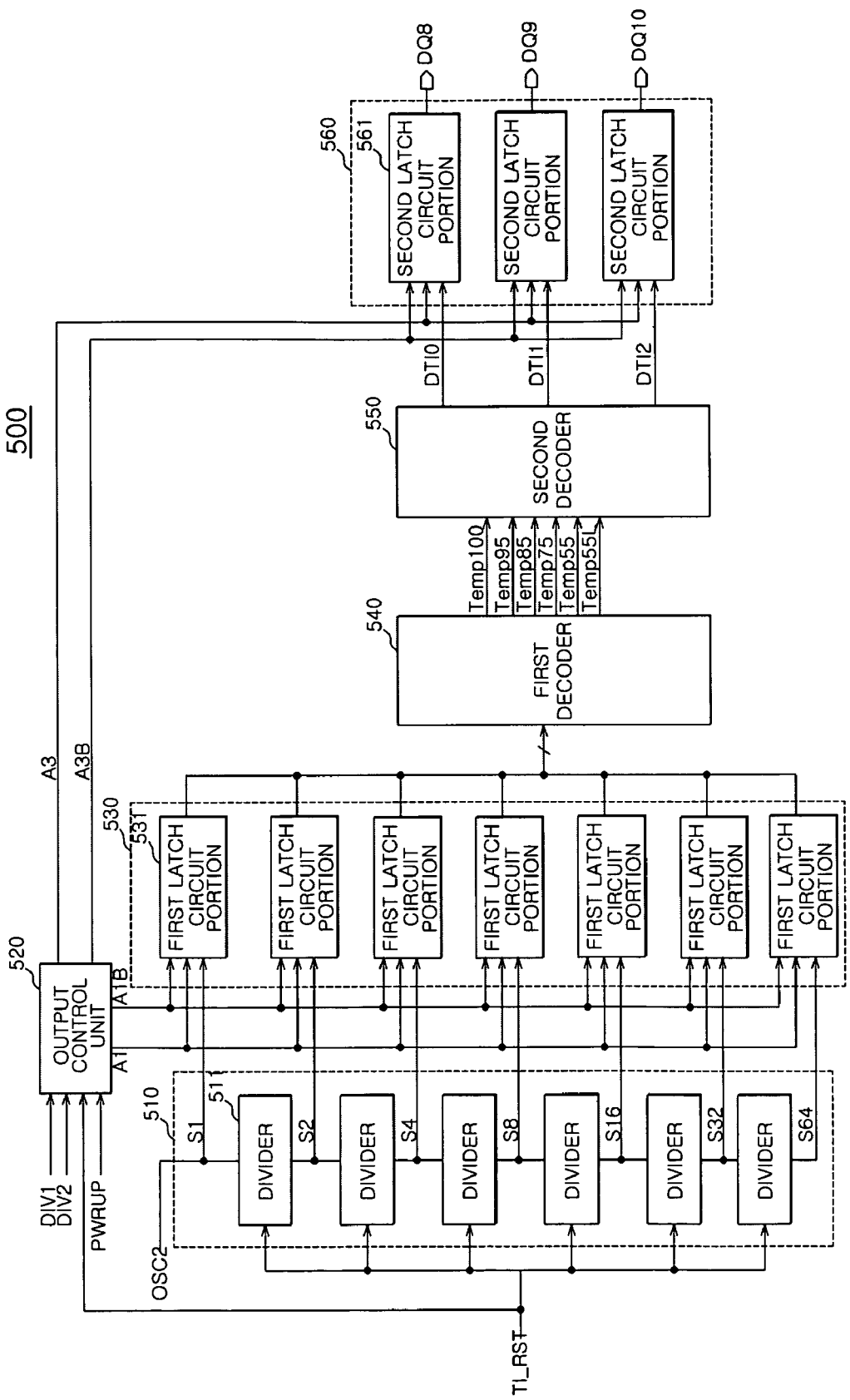
FIG. 3 is a schematic block diagram of an exemplary temperature information generating portion capable of being implemented in the generator of FIG. 2 according to one embodiment.

FIG. 3 is a schematic block diagram of an exemplary temperature information generating portion capable of being implemented in the generator of FIG. 2 according to one embodiment. In FIG. 3, the temperature information generating part 500 can be configured to include a multiple dividing signal generating unit 510, an output control unit 520, a dividing signal latching unit 530, a first decoder 540, a second decoder 550, and a temperature code latching unit 560.

The multiple dividing signal generating unit 510 can be configured to generate temperature information by latching and decoding multiple dividing signals 'S1' to 'S64' acquired by multi-dividing the second period signal 'OSC2' according to a transition timing of the first period signal 'OSC1'. For example, the multiple dividing signal generating unit 510 can include a plurality of dividers 511 that sequentially divides and outputs the second period signal 'OSC2' at predetermined dividing ratio X2 by receiving the second period signal 'OSC2'. The plurality of dividers 511 may be configured in substantially the same manner as each other.

The output control unit 520 can be configured to generate first transmission control signals 'A1' and 'A1B' and second transmission control signals 'A3' and 'A3B' according to the first dividing period signal 'DIV1', the second dividing period signal 'DIV2', a power-up signal 'PWRUP', and a second reset signal 'TI_RST'.

The dividing signal latching unit 530 can be configured to latch the multiple dividing signals 'S1' to 'S64' according to the first transmission control signals 'A1' and 'A1B'. For example, the dividing signal latching unit 530 can include a plurality of first latching circuit portions 531 that can commonly receive the first transmission control signals 'A1' and 'A1B', and can receive the multiple dividing signals 'S1' to 'S64' output from the plurality of dividers 511. The plurality of first latching circuit portions 531 may be configured in substantially the same manner as each other.

The first decoder 540 can be configured to decode the multiple dividing signals 'S1' to 'S64' latched in the dividing signal latching unit 530 into digital preliminary code signals 'Temp100' to 'Temp55L' for defining the temperature.

The second decoder 550 can be configured to output the preliminary codes Temp100 to Temp55L by decoding the preliminary codes Temp100 to Temp55L into digital 3-bit temperature codes DTI0 to DTI2 according to a semiconductor memory specification, such as the JEDEC specification.

The temperature code latching unit 560 can be configured to output the temperature codes DTI0 to DTI2 to pads DQ8 to DQ10 by latching the temperature codes DTI0 to DTI2 according to the second transmission control signals 'A3' and 'A3B'. For example, the temperature code latching unit 560 can include a plurality of second latching portions 561 that can commonly receive the second transmission control signals 'A3' and 'A3B', and can receive the temperature codes DTI0 to DTI2. The plurality of second latching circuit portions 561 may be configured in substantially the same manner as each other.

Figure 4:
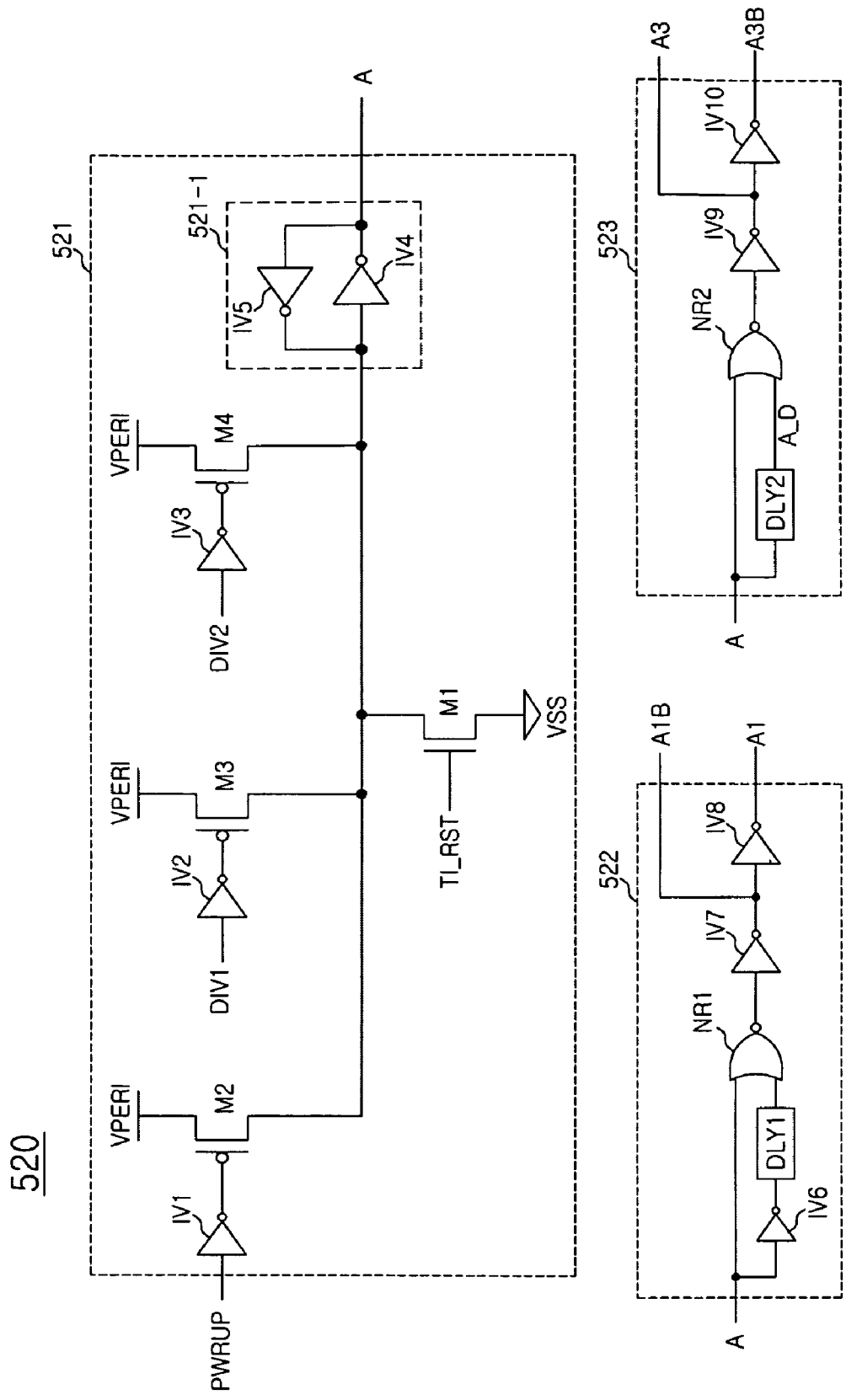
FIG. 4 is a schematic circuit diagram of an exemplary output control unit capable of being implemented in the portion of FIG. 3 according to one embodiment.

FIG. 4 is a schematic circuit diagram of an exemplary output control unit capable of being implemented in the portion of FIG. 3 according to one embodiment. In FIG. 4, the output control unit 520 can be configured to include a temperature sensing section signal generating portion 521, a first transmission control signal generating portion 522, and a second transmission control signal generating portion 523.

The temperature sensing section signal generating portion 521 can be configured to generate a temperature sensing section signal 'A' according to the first dividing period signal 'DIV1', the second dividing period signal 'DIV2', the power-up signal 'PWRUP', and the second reset signal 'TI_RST'. For example, the temperature sensing section signal generating portion 521 can include a plurality of inverters IV1 to IV3, a plurality of transistors M1 to M4, and a latch 521-1.

In FIG. 4, the transistor M1 can be configured to activate the temperature sensing section signal 'A' to a high level in response to the second reset signal 'TI_RST'. The inverter IV1 and the transistor M2 can be configured to initialize the temperature sensing section signal 'A' to a low level in response to the power-up signal 'PWRUP'. The inverter IV2 and the transistor M3 can be configured to deactivate the temperature sensing section signal 'A' in response to the first dividing period signal 'DIV1'. The inverter IV3 and the transistor M4 can be configured to deactivate the temperature sensing section signal 'A' in response to the second dividing period signal 'DIV2'. The latch 521-1 can be configured to maintain a level of the temperature sensing section signal 'A' by being commonly connected with drain terminals of the plurality of transistors M1 to M4.

The temperature sensing section signal generating portion 521 can operate only with the first dividing period signal 'DIV1' and without the second dividing period signal 'DIV2'. Alternatively, the second dividing period signal DIV2 can be additionally used. When the first dividing period signal 'DIV1', which can be acquired by dividing the first period signal 'OSC1', is used as a criterion for determining the self refresh period, the first period signal 'OSC1' can increase at a predetermined temperature, i.e. about 37° C., or lower, whereby a refresh failure may occur. Accordingly, in order to prepare for a situation in which the temperature is about 37° C. or lower, a cold stopper function can be implemented by adding a circuit that can receive the second dividing period signal 'DIV2' acquired by dividing the second period signal 'OSC2'. Here, using the first dividing period signal 'DIV1' acquired by dividing the first period signal 'OSC1' and the second dividing signal 'DIV2' acquired by dividing the second period signal 'OSC2' can improve temperature sensing performance as the dividing ratio increases.

The first transmission control signal generating portion 522 can be configured to generate the first transmission control signals 'A1' and 'A1B' according to the temperature sensing section signal 'A'. For example, the first transmission control signal generating portion 522 can include a pulse generating circuit composed of a plurality of inverters IV6 to IV8, a delay element DLY1, and a NOR gate NR1. The generated first transmission control signals 'A1' and 'A1B' can have a pulse width corresponding to a delay time of the delay element DLY1 at a time when the temperature sensing section signal 'A' is deactivated.

The second transmission control signal generating portion 523 can be configured to generate the second transmission control signals 'A3' and 'A3B' according to the temperature sensing section signal 'A' and a delayed temperature sensing section signal 'A_D'. For example, the second transmission control signal generating portion 523 can include a delay element DLY2, a NOR gate NR2, and a plurality of inverters IV9 and IV10. The second transmission control signals 'A3' and 'A3B' can be generated by logically adding the temperature sensing section signal 'A' and the delayed temperature sensing section signal 'A_D'.

Figure 5:
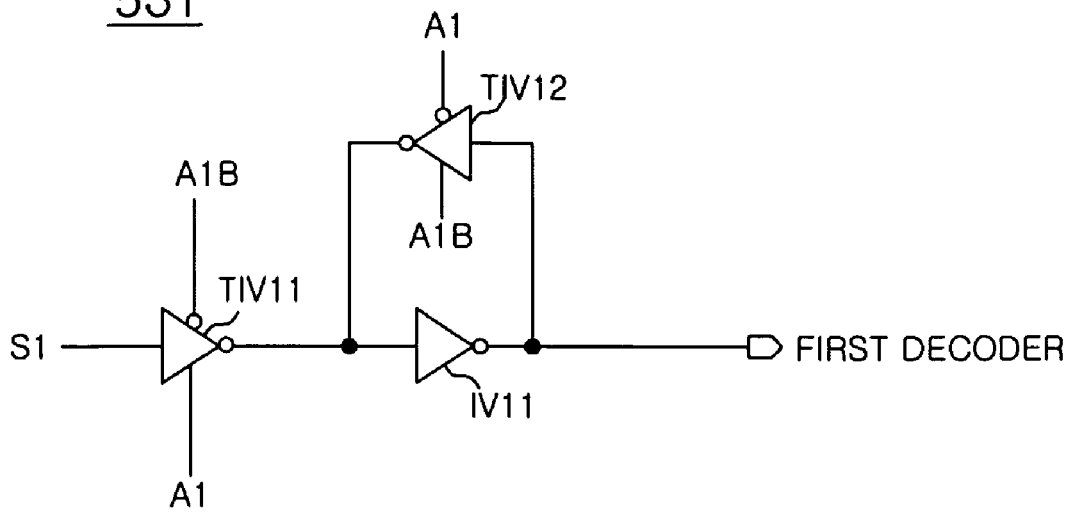
FIG. 5 is a schematic circuit diagram of a first latch circuit unit capable of being implemented in the portion of FIG. 3 according to one embodiment.

FIG. 5 is a schematic circuit diagram of a first latch circuit unit capable of being implemented in the portion of FIG. 3 according to one embodiment. In FIG. 5, the first latch circuit portion 531 can be configured to include a plurality of 3-state inverters TIV11 and TIV12 and an inverter IV11, wherein the 3-state inverter TIV12 and the inverter IV11 can form a latch. The 3-state inverter TIV11 can be configured to allow the multiple dividing signal 'S1' to pass according to the first transmission control signals 'A1' and 'A1B'. Here, the 3-state inverter TIV12 can determine whether or not the latch operates according to the first transmission control signals 'A1' and 'A1B'.

Figure 6:
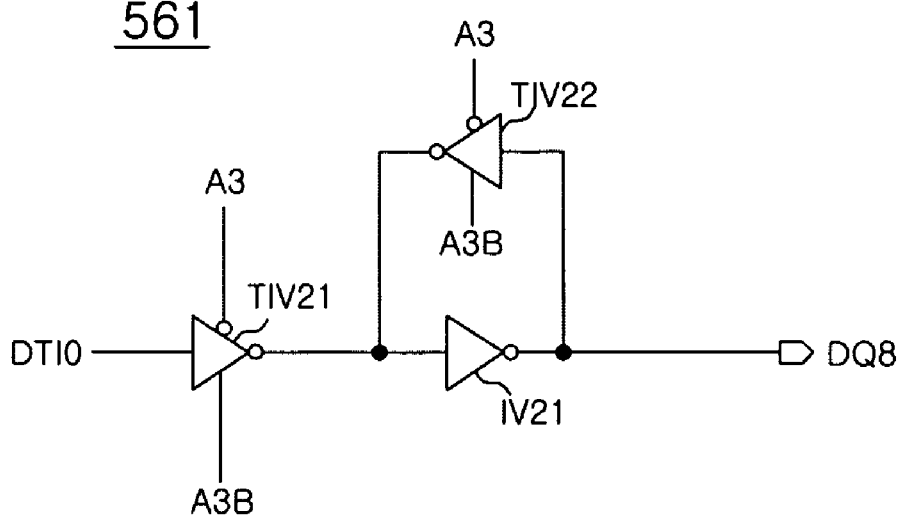
FIG. 6 is a schematic circuit diagram of an exemplary second latch circuit unit capable of being implemented in the portion of FIG. 3 according to one embodiment.

FIG. 6 is a schematic circuit diagram of an exemplary second latch circuit unit capable of being implemented in the portion of FIG. 3 according to one embodiment. In FIG. 6, the second latch circuit portion 561 can include a plurality of 3-state inverters TIV21 and TIV22 and an inverter IV21, wherein the 3-state inverter TIV22 and the inverter IV21 can form a latch. The 3-state inverter TIV21 can be configured to allow the temperature code DT10 to pass according to the second transmission control signals 'A3' and 'A3B'. Here, the 3-state inverter TIV22 can determine whether or not the latch operates according to the second transmission control signals 'A3' and 'A3B'.

Figure 7:
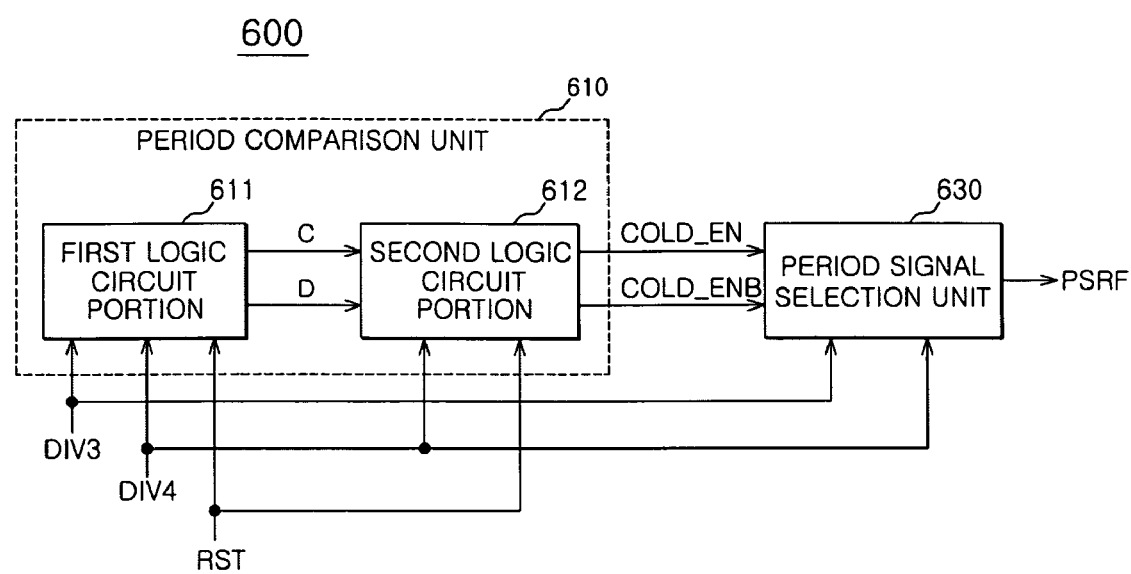
FIG. 7 is a schematic block diagram of an exemplary refresh signal generating portion capable of being implemented in the generator of FIG. 2 according to one embodiment.

FIG. 7 is a schematic block diagram of an exemplary refresh signal generating portion capable of being implemented in the generator of FIG. 2 according to one embodiment. In FIG. 7, the refresh period signal generating part 600 can be configured to select and output the third dividing period signal 'DIV3' as a refresh period signal 'PSRF' when the period of the third dividing period signal 'DIV3' is not substantially longer than the period of the fourth dividing period signal 'DIV4'. For example, the refresh period signal generating part 600 can include a period comparison unit 610 and a period signal selecting unit 630.

The period comparison unit 610 can be configured to output control signals 'COLD_EN' and 'COLD_ENB' for selecting any one of the third dividing period signal 'DIV3' and the fourth dividing period signal 'DIV4' by comparing pulse generating timings of the third dividing period signal 'DIV3' and the fourth dividing period signal 'DIV4'. For example, the period comparison unit 610 can include a first logic circuit portion 611 and a second logic circuit unit 612.

Figure 8:
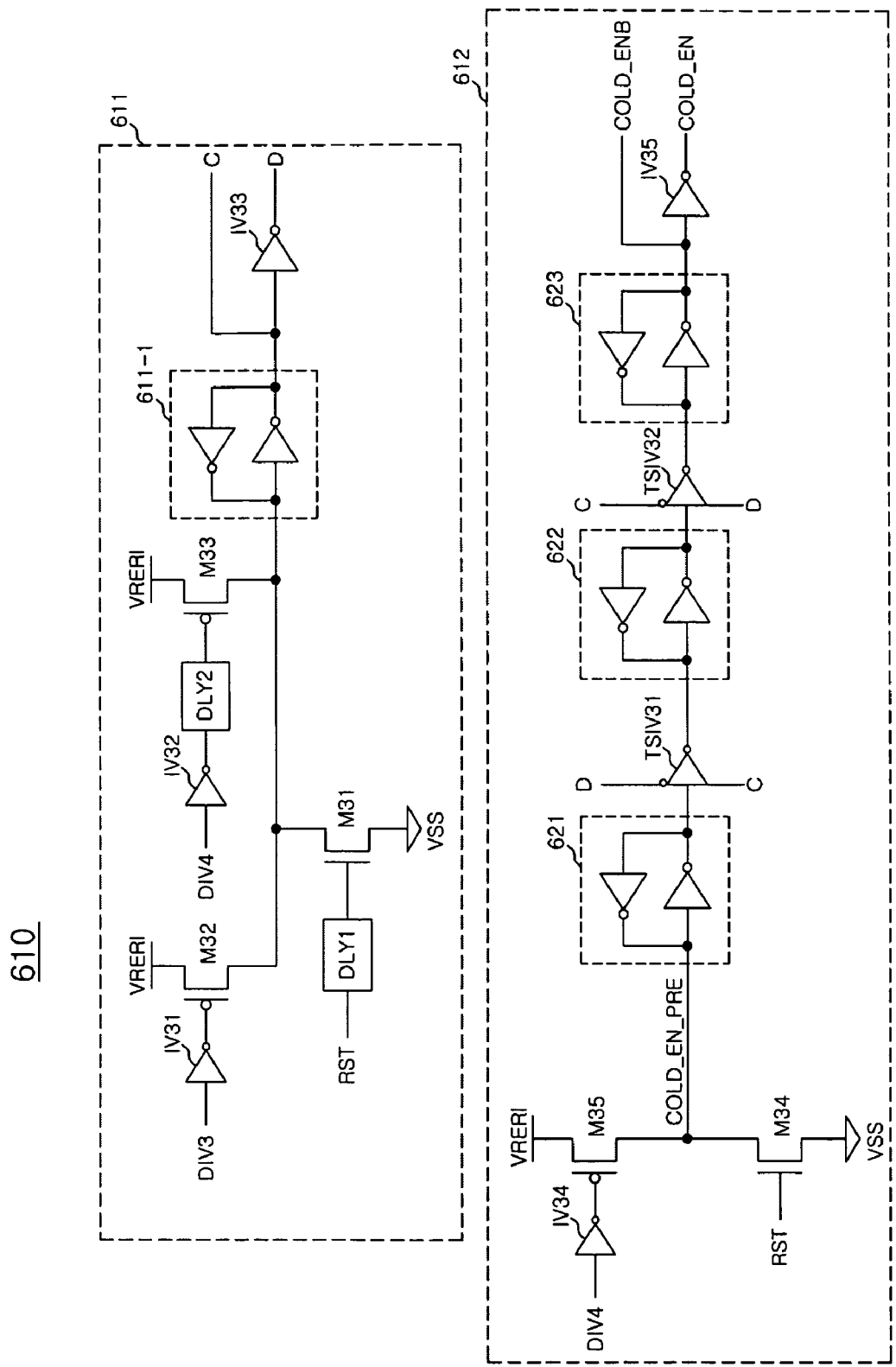
FIG. 8 is a schematic circuit diagram of an exemplary period comparison unit capable of being implemented in the portion of FIG. 7 according to one embodiment.

FIG. 8 is a schematic circuit diagram of an exemplary period comparison unit capable of being implemented in the portion of FIG. 7 according to one embodiment. In FIG. 8, the first logic circuit portion 611 can be configured to initialize comparison signals 'C' and 'D' depending on the first reset signal 'RST', and can transition levels of the comparison signals 'C' and 'D' in response to the third dividing period signal 'DIV3' and the fourth dividing period signal 'DIV4' with a predetermined time difference. For example, the first logic circuit portion 611 can include first to third inverters IV31 to IV33, first and second delay elements DLY31 and DLY32, first to third transistors M31 to M33, and a latch 611-1.

In FIG. 8, the first delay element DLY 31 can be configured to receive the first reset signal 'RST'. The first transistor M31 can be connected to a ground terminal VSS at a source terminal thereof and can receive an output of the first delay element DLY31 at a gate terminal thereof. The first inverter IV31 can be configured to receive the third dividing period signal 'DIV3'. The second transistor M32 can be connected to a power supply terminal VPERI at a source terminal thereof and can receive an output of the first inverter IV31 at a gate terminal thereof. The second inverter IV32 can be configured to receive the fourth dividing period signal 'DIV4', and the second delay element DLY32 can be configured to receive an output of the second inverter IV32. The third transistor M33 can be connected to the power supply terminal VPERI at a source terminal thereof and can receive an output of the second delay element DLY32 at a gate terminal thereof. In addition, drain terminals of the first to third transistors M31 to M33 can be commonly connected to each other. The latch 611-1 can have an input terminal connected to the drain terminal of the third transistor M33. The third inverter IV33 can have an input terminal connected to an output terminal of the latch 611-1. In addition, a delay time of the first delay element DLY31 can be substantially the same as that of the second delay element DLY32.

In FIG. 8, the second logic circuit portion 612 can be configured to output any one of a pre-control signal 'COLD_EN_PRE' having a level corresponding to the first reset signal 'RST' and a pre-control signal 'COLD_EN_PRE' having a level corresponding to the fourth dividing period signal 'DIV4' according to the transition timings of the comparison signals 'C' and 'D' as the control signals 'COLD_EN' and 'COLD_ENB'. For example, the second logic circuit portion 612 can include fourth and fifth inverters IV34 and IV35, fourth and fifth transistors M34 and M35, second to fourth latches 621 to 623, and first and second 3-state inverters TSIV31 and TSIV32. The fourth transistor M34 can be connected to the ground terminal VSS at a source terminal thereof and can receive the first reset signal 'RST' at a gate terminal thereof. The fourth inverter IV34 can be configured to receive the fourth dividing period signal 'DIV4'. The fifth transistor M35 can be connected to the power supply VPERI at a source terminal thereof and can receive an output of the fourth inverter IV34 at a gate terminal thereof. The latch 621 can have an input terminal connected to drain terminals of the fourth and fifth transistors M34 and M35.

The first 3-state inverter TSIV31 can have an input terminal connected to an output terminal of the first latch 621 and a control terminal that can receive the comparison signals 'C' and 'D'.

The second latch 622 can have an input terminal connected to an output terminal of the first 3-state inverter TSIV31. The second 3-state inverter TSIV32 can have an input terminal connected to an output terminal of the second latch 622 and a control terminal that can receive the comparison signals 'C' and 'D'. In addition, the third latch 623 can have an input terminal connected to an output terminal of the second 3-state inverter TSIV32. The fifth inverter IV35 can have an input terminal connected to an output terminal of the third latch 623.

Figure 9:
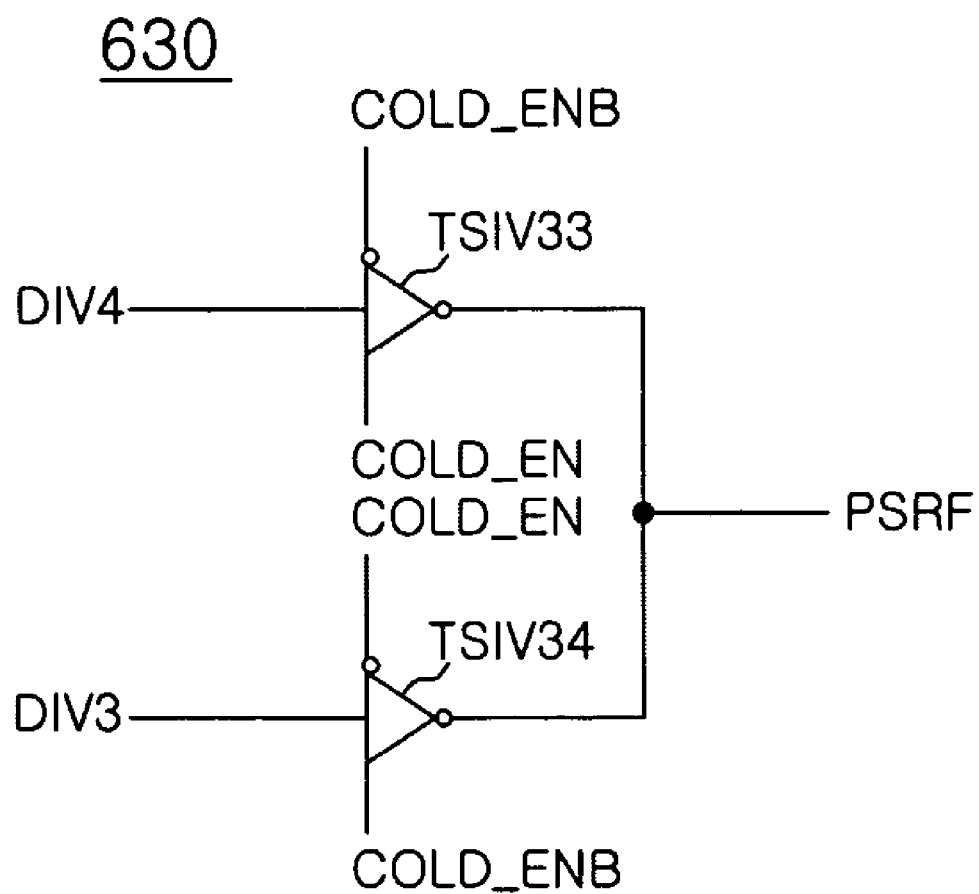
FIG. 9 is a schematic circuit diagram of an exemplary period signal selecting unit capable of being implemented in the portion of FIG. 7 according to one embodiment.

FIG. 9 is a schematic circuit diagram of an exemplary period signal selecting unit capable of being implemented in the portion of FIG. 7 according to one embodiment. In FIG. 9, the period signal selecting unit 630 can be configured to select any one of the third dividing period signal 'DIV3' and the fourth dividing period signal 'DIV4' according to the control signals 'COLD_EN' and 'COLD_ENB' to output the selected one signal as the refresh period signal 'PSRF'. For example, the period signal selecting unit 630 can include third and fourth 3-state inverters TSIV33 and TSIV34.

The third-3-state inverter TSIV33 can receive the fourth dividing period signal 'DIV4' at an input terminal thereof and can receive the control signals 'COLD_ENB' and 'COLD EN' at a control terminal thereof. The fourth 3-state inverter TSIV34 can receive the third dividing period signal 'DIV3' at an input terminal thereof and can receive the control signals 'COLD_EN' and 'COLDN_ENB' at a control terminal thereof. In addition, the output terminal can be commonly connected to an output terminal of the 3-state inverter TSIV33.

Figure 10:
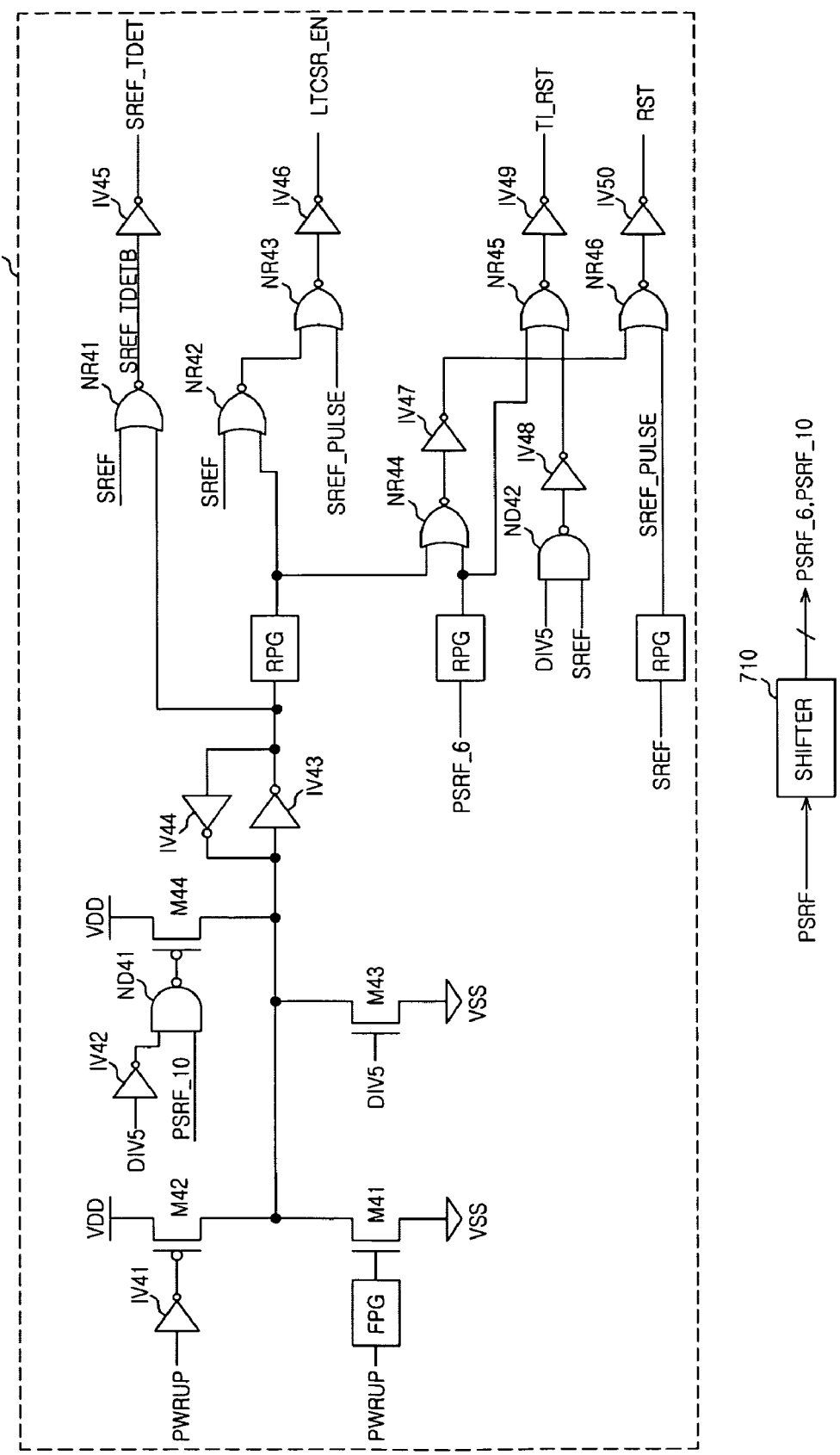
FIG. 10 is a schematic circuit diagram of an exemplary operation timing control part capable of being implemented in the generator of FIG. 2 according to one embodiment.

FIG. 10 is a schematic circuit diagram of an exemplary operation timing control part capable of being implemented in the generator of FIG. 2 according to one embodiment. In FIG. 10, the operation timing control part 700 can be configured to generate timing signals, such as the first reset signal 'RST', the second reset signal 'TI_RST', the enable signal 'LTCSR_EN', and the operation section signal 'SERF_TDET', according to the power-up signal 'PWRUP', a self refresh signal 'SREF', a fifth dividing period signal 'DIV5', and the refresh period signal 'PSRF'. For example, the operation timing control part 700 can include a shifter 710 and a timing signal generating unit 720.

In FIG. 10, the shifter 710 can be configured to generate a first shift signal 'PSRF_6' and a second shift signal 'PSRF_10' by shifting the refresh period signal 'PSRF' by different times.

The timing signal generating unit 720 can be configured to generate the first reset signal 'RST', the second reset signal 'TI_RST' the enable signal 'LTCSR_EN', and the operation section signal 'SERF_TDET' according to the power signal 'PWRUP', the fifth dividing period signal 'DIV5', the self refresh signal 'SREF', the first shift signal 'PSRF_6', and the second shift signal 'PSRF_10'. For example, the timing signal generating unit 720 can include first to tenth inverters IV41 to IV50, a NAND gate ND41, first to sixth NOR gates NR41 to NR46, a rising pulse generating portion RPG, a falling pulse generating portion FPG, and first to fourth transistors M41 to M44. The rising pulse generating portion RPG can be configured to generate a pulse having a predetermined width by sensing a rising edge of an input signal. The falling pulse generating portion FPG can be configured to generate a pulse having a predetermined width by sensing a falling edge of the input signal.

In FIG. 10, the operation section signal 'SERF_TDET' can be used to define a temperature detecting section. For example, the operation section signal 'SERF_TDET' can be generated to have an activation section substantially the same as an activation section of the self refresh signal 'SREF', or to have an activation section corresponding to a section from a time when the power signal 'PWRUP' is generated to a time when the second shift signal 'PSRF_10' is generated. The activation section of the operation section signal 'SERF_TDET' can correspond to a section of predetermined multiple periods, such as 9, for example, of the refresh period signal 'PSRF'.

The enable signal 'LTCSR_EN', which can be a signal used for initializing a reference generation block (Widlar Reference) in the first period signal generating part 100, can be generated as a pulse-type signal. The reference generation block (Widlar Reference) can be turned OFF to reduce current and can start operation by being initialized by the enable signal 'LTCSR_EN'. For example, the enable signal 'LTCSR_EN' can be generated at a time when the operation section signal 'SERF_TDET' starts to become activated.

The first reset signal RST can be used for initializing the first period signal generating part 100, the second period signal generating part 300, the dividing part 400, and the refresh period signal generating part 600. For example, the first reset signal RST can be generated at a time when the power-up signal 'PWRUP' is generated, a time when the fifth dividing period signal 'DIV5' is generated, or at a time when the first shift signal 'PSRF_6' is generated.

The second reset signal TI_RST can be used for initializing the temperature information generating part 500. For example, the second reset signal TI_RST can be generated depending on the first shift signal 'PSRF_6'. The second reset signal TI_RST is generated depending on the first shift signal 'PSRF_6' such that the reference generation block (Widlar Reference) in the first period signal generating part 100 is not stably initialized at the time when the temperature detecting section is started, i.e., the time when the operation section signal 'SERF_TDET' is activated, whereby the first period signal 'OSC1' is not normal. Thus, the temperature information generating part 500 can start to operate after the first shift signal 'PSRF_6' is generated in order to stabilize the first period signal 'OSC1'.

In FIG. 10, the operation timing control part 700 can have a circuit configuration so that the operation section signal 'SERF_TDET', the enable signal 'LTCSR_EN', the first reset signal 'RST', and the second reset signal 'TI_RST' can be generated according to the timings detailed above.

An exemplary method of generating digital temperature information by using the refresh period signal generator with the digital temperature information generation function will be described with reference to FIGS. 11 and 12.

Figure 11:
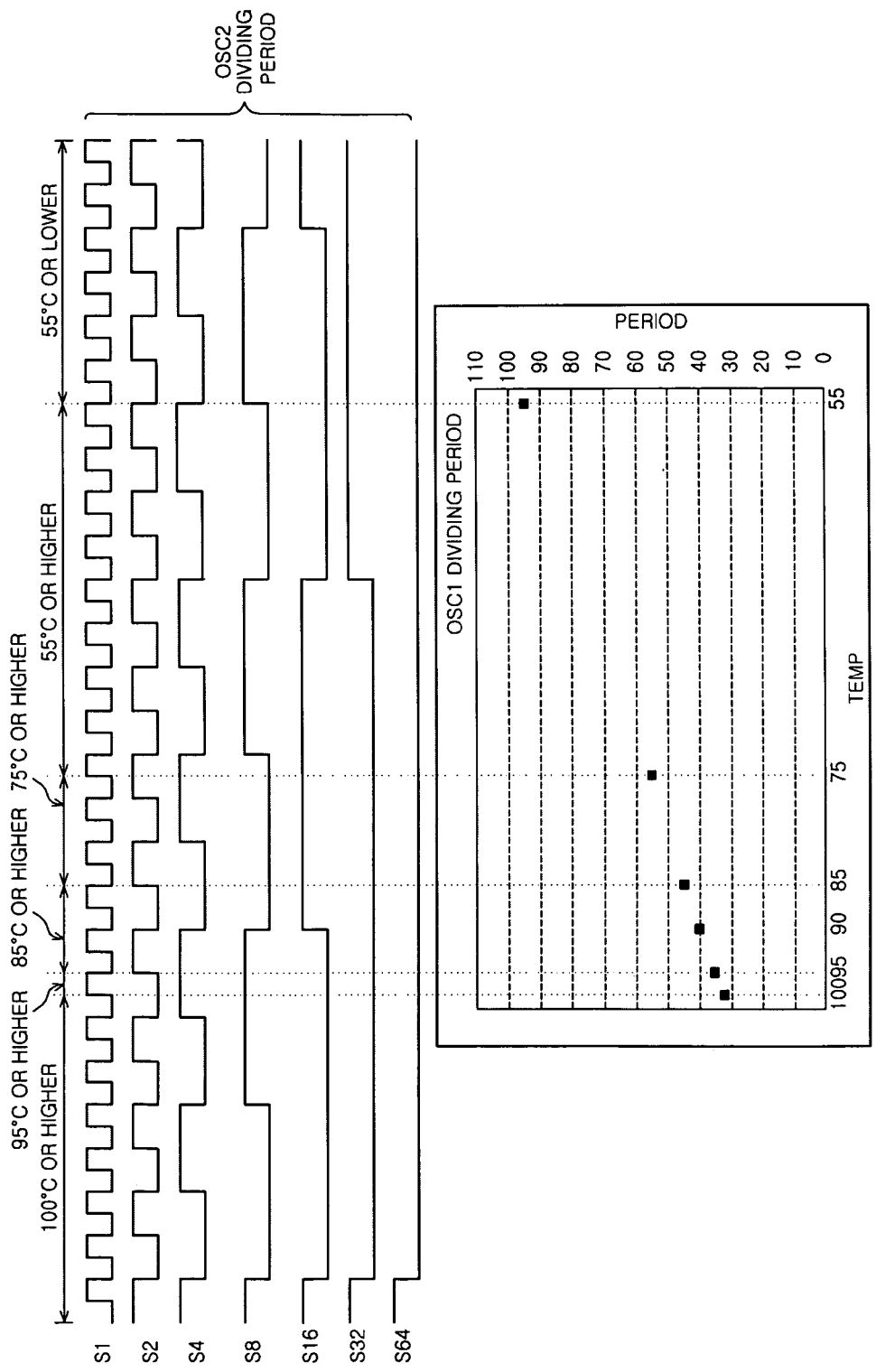
FIG. 11 is a graph illustrating an exemplary comparison between periods of a first period signal and a second period signal depending on a temperature according to one embodiment.
Figure 12:
FIG. 12 is a schematic diagram illustrating an exemplary method of decoding a temperature code according to one embodiment.

FIG. 11 is a graph illustrating an exemplary comparison between periods of a first period signal and a second period signal depending on a temperature according to one embodiment, and FIG. 12 is a schematic diagram illustrating an exemplary method of decoding a temperature code according one embodiment. Initially, a generation principle of the digital temperature information will be described.

Since the period of the first period signal 'OSC1' can depend on the temperature, the pulse generation timing can vary. In FIG. 11, the pulse generation timing of the first period signal 'OSC1' can be substantially matched with the multiple dividing signals 'S1' to 'S64' that can be acquired by dividing the second period signal 'OSC2' for each temperature section. For example, the multiple dividing signals 'S1' to 'S64' can have a predetermined period regardless of the temperature. As a result, values of the multiple dividing signals 'S1' to 'S64' can be read by latching the multiple dividing signals 'S1' to 'S64' at the timing when the pulse of the first period signal 'OSC1' is generated can be substantially the same as values shown in FIG. 12. Accordingly, the multiple dividing signals 'S1' to 'S64' can be latched at the timing when the pulse of the first dividing period signal 'DIV1' acquired by dividing the first period signal 'OSC1' and the latched value is decoded. Thus, the value can be output as digital temperature information that conforms to the JEDEC specification, as shown in FIG. 12. In FIG. 12, a temperature range does not conform to the JEDEC specification and an example of a value which may be arbitrarily set by a manufacturer is illustrated.

Figure 13:
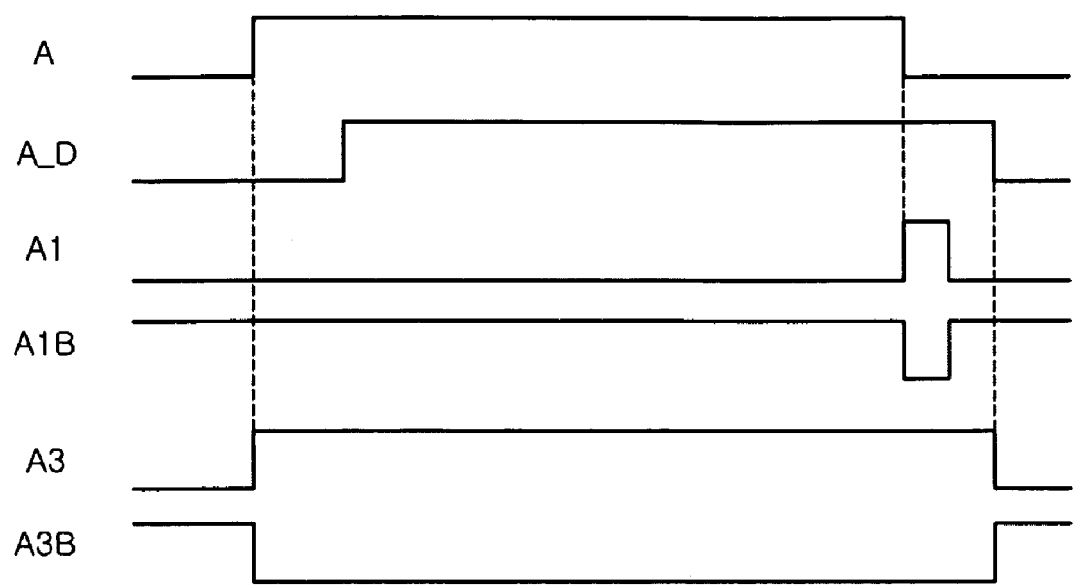
FIG. 13 is a timing diagram demonstrating an exemplary operation of an output control unit capable of being implemented in the portion of FIG. 3 according to one embodiment.

FIG. 13 is a timing diagram demonstrating an exemplary operation of an output control unit capable of being implemented in the portion of FIG. 3 according to one embodiment. In FIG. 13, when the first reseat signal 'RST' is generated, the first period signal generating part 100 can output the first period signal 'OSC1' (in FIG. 2) and the second period signal generating part 300 can output the second period signal 'OSC2' (in FIG. 2).

When the first reset signal 'RST' is generated, the dividing part 400 can output the third dividing period signal 'DIV3' and the fourth dividing period signal 'DIV4' by dividing the first period signal 'OSC1' and the second period signal 'OSC2'. In addition, the temperature sensing section signal generating portion 521 (in FIG. 4) can initialize the temperature sensing section signal 'A' to a low level according to the power-up signal 'PWRUP' generated in initially operating a semiconductor integrated circuit before the second reset signal 'TI_RST' can be generated.

While the temperature sensing section signal 'A' is initialized to the low level, the first transmission control signal generating portion 522 (in FIG. 4) can generate the first transmission control signals 'A1' and 'A1B', i.e., 'A1' is a low level and 'A1B' is a high level, and the second transmission control signal generating portion 523 can generate the second transmission control signals 'A3' and 'A3B' i.e., 'A3' is a low level and 'A3B' is a high level.

The input to the first latch circuit portion 531 (in FIG. 5) can be intercepted according to the first transmission control signals 'A1' and 'A1B', i.e., 'A1' is a low level and 'A1B' is a high level, and the first latch circuit portion 531 does not receive the multiple dividing signals 'S1' to 'S64'. While the input to the first latch circuit portion 531 can be intercepted, the latch, including IV11 and TIV12, can continuously operate, thereby maintaining the previous output signal level.

The second latch circuit portion 561 (in FIG. 6) can latch the temperature codes DTI0 to DTI2 output from the second decoder 550 (in FIG. 3) according to the second transmission control signals 'A3' and 'A3B', i.e., 'A3' is a low level and 'A3B' is a high level, to output the temperature codes DTI0 to DTI2 to the pads DQ8 to DQ10. In addition, as the second reset signal 'TI_RST' is generated, the generating operation of the multiple dividing signals 'S1' to 'S64' using the second period signal 'OSC2' can be started in each divider 511 of the multiple dividing signal generating unit 510 (in FIG. 3).

As the second reset signal 'TI_RST' is generated, the temperature sensing section signal generating portion 521 (in FIG. 4) can activate the temperature sensing section signal 'A' to a high level. While the temperature sensing section signal 'A' is activated to the high level, the first transmission control signal generating portion 522 (in FIG. 4) can generate the first transmission control signals 'A1' and 'A1B', i.e., 'A1 is a low level and 'A1B' is a high level, and the second transmission control signal generating portion 523 (in FIG. 4) can generate the second transmission control signals 'A3' and 'A3B', i.e., 'A3' is a high level and 'A3B' is a low level.

The input to the first latch circuit portion 531 (in FIG. 5) can be continuously intercepted according to the first transmission control signals 'A1' and 'A1B', i.e., 'A1' is a low level and 'A1B' is a high level, and the first latch circuit portion 531 does not receive the multiple dividing signals 'S1' to 'S64'. While the input to the first latch circuit portion 531 is intercepted, the latch, including IV11 and TIV12, can continuously operate, thereby maintaining the previous output signal level.

The input to the second latch circuit portion 561 (in FIG. 6) can be intercepted according to the second transmission control signals 'A3' and 'A3B', i.e., 'A3' is a high level and 'A3B' is a low level, and the second latch circuit portion 561 does not receive the temperature codes DTI0 to DTI2 currently output from the second decoder 550 and the latch, including IV21 and TIV22, can stop.

As a first pulse of the first dividing period signal 'DIV1' or a first pulse of the second dividing period signal 'DIV2' is generated after the generation operation of the first dividing period signal 'DIV1' and the second dividing period signal 'DIV2' is started, the temperature sensing section signal generating portion 521 (in FIG. 4) can deactivate the temperature sensing section signal 'A' to a low level. When the temperature sensing section signal 'A' is deactivated to the low level, the first transmission control signal generating portion 522 (in FIG. 4) can generate the first transmission control signals 'A1' and 'A1B' having the pulse width corresponding to the delay element DLY1, and the second transmission control signal generating portion 523 (in FIG. 4) can generate the second transmission control signals 'A3' and 'A3B', i.e., 'A3' is a low level and 'A3B' is a high level, at the timing when the delayed temperature sensing section signal 'A_D' is deactivated.

In the section of the pulse width of the first transmission control signals 'A1' and 'A1B' having the pulse width corresponding to the delay element DLY1, the first latch circuit portion 531 (in FIG. 5) can receive the multiple dividing signals 'S1' to 'S64' and can output the multiple dividing signals 'S1' to 'S64' to the first decoder 540 (in FIG. 3). After the input to the first latch circuit portion 521 is intercepted, the latch, including IV11 and TIV12 (in FIG. 5), can operate, thereby maintaining the previous output signal level.

The first decoder 540 (in FIG. 3) can decode the multiple dividing signals 'S1' to 'S64' to output the preliminary codes Temp100 to Temp55L. Here, the preliminary codes Temp100 to Temp55L can be acquired by decoding only codes in a temperature range, which corresponds to the values of the multiple dividing signals 'S1' to 'S64' to a high level. For example, if the values of the multiple dividing signals 'S1' to 'S64' are any one selected from --X/X/X/L/L/L/L--, --X/X/L/H/L/L/L--, and --L/L/H/H/L/L/L--, then the temperature can be about 100° C. or higher. Thus, only Temp 100 among the preliminary codes Temp100 to Temp55L can be decoded to a high level and the remaining values can be decoded to a low level. Here, "X" among the multiple dividing signals S1 to S64 denotes a condition of "don't care", "L" denotes the low level, and "H" denotes the high level.

The decoder 550 (in FIG. 3) can decode the preliminary codes Temp100 to 55L to the temperature codes DTI0 to DTI2 according to the JEDEC specification to output the temperature codes DTI0 to DTI2. As shown in FIG. 12, for example, if only --Temp85-- among the preliminary codes Temp100 to Temp55L is decoded to a high level, then the temperature codes DTI0 to DTI2 can be decoded to be --101--. For another example, if only --Temp75-- among the preliminary codes Temp100 to Temp55L is decoded to a high level, then the temperature codes DTI0 to DTI2 can be decoded to be --001--.

During the first latch circuit portion 531 (in FIG. 5) receiving the multiple dividing signals 'S1' to 'S64', i.e., during the levels of the first transmission control signals 'A1' and 'A1B', 'A1' is a high level and 'A1B' is a low level, are maintained, a decoding operation can be performed by the first decoder 540 (in FIG. 3) or the second decoder 550 (in FIG. 3) and the resultant temperature codes DTI0 to DTI2 can be output.

As the second transmission control signals 'A3' and 'A3B', i.e., 'A3' is a low level and 'A3B' is a high level, are generated, the second latch circuit portion 561 (in FIG. 6) can output the temperature codes DTI0 to DTI2 to pads DQ8 to DQ10 by latching the temperature codes DTI0 to DTI2 output from the second decoder 550 (in FIG. 3). During the input to the first latch circuit portion 531 (in FIG. 5) is intercepted, the input levels and the output level of the first decoder 540 (in FIG. 3) and the second decoder 550 (in FIG. 3) are not transitioned, whereby it is possible to minimize current consumption.

Figure 14:
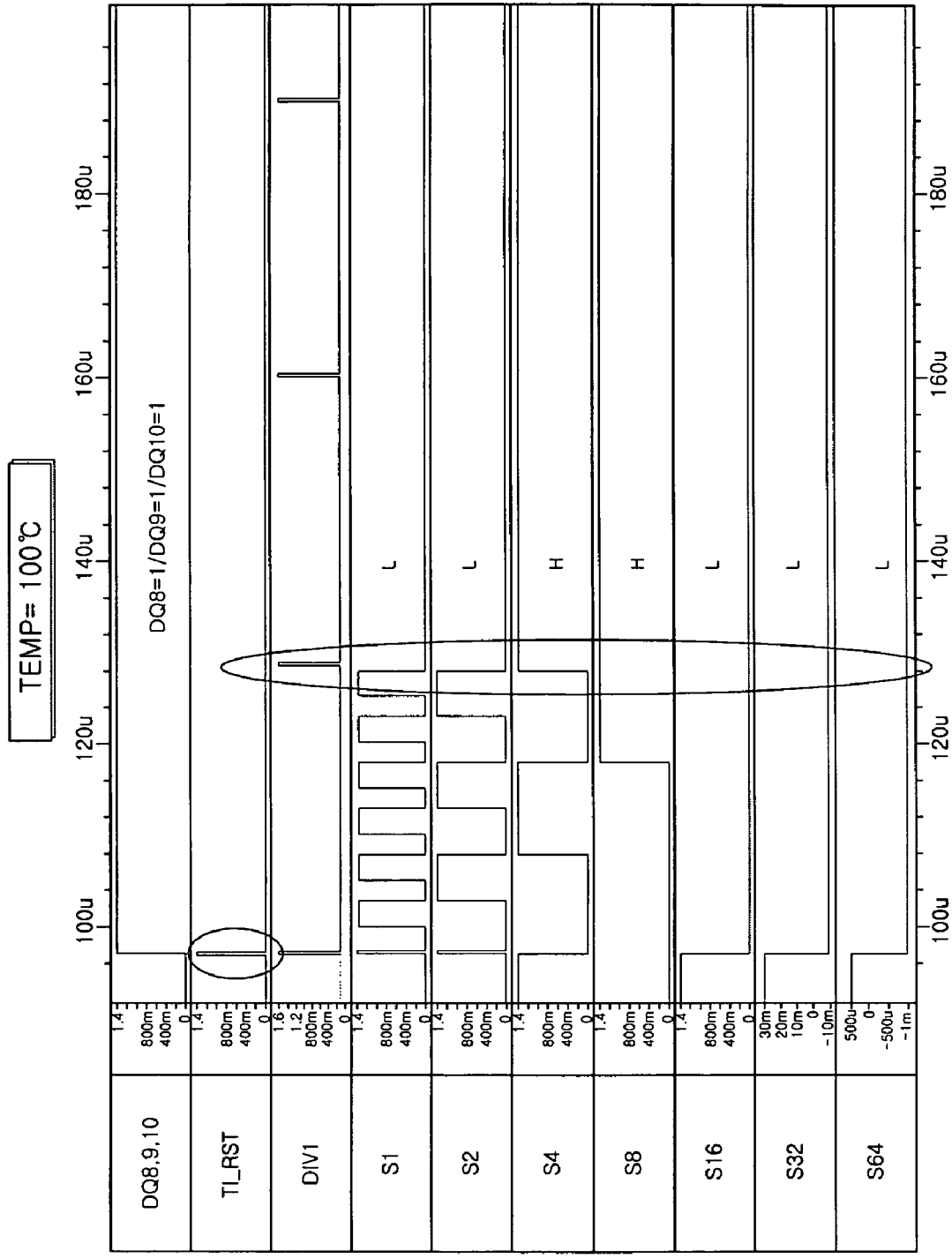
FIGS. 14 and 15 are waveform diagrams demonstrating exemplary a temperature code decoding simulation according to one embodiment.
Figure 15:
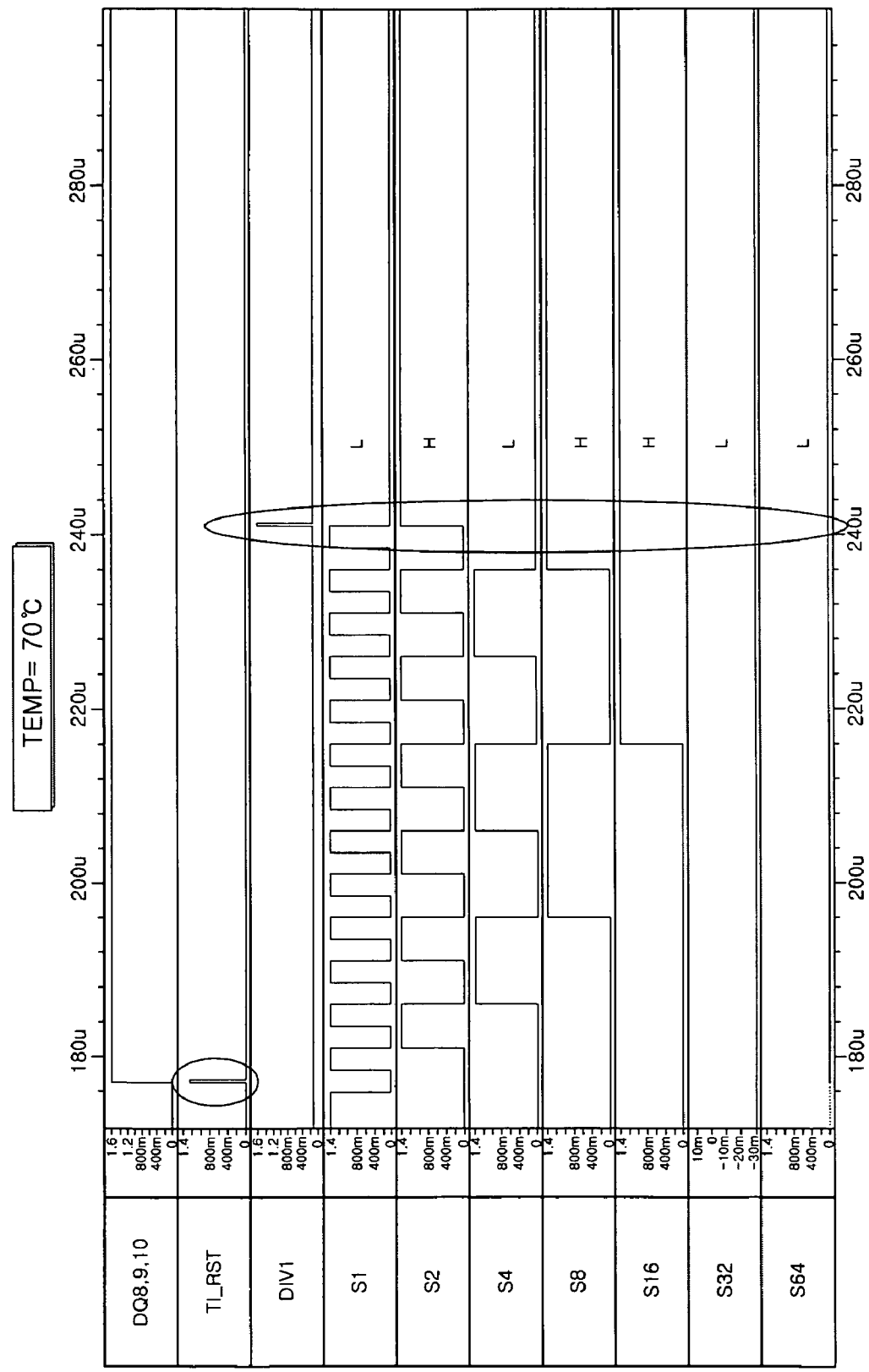

FIGS. 14 and 15 are waveform diagrams demonstrating exemplary a temperature code decoding simulation according to one embodiment. An actual simulation result at a temperature of about 100° C. is shown in FIG. 14. Values acquired by latching the multiple dividing signals 'S1' to 'S64' is --L/L/H/H/L/L/L-- at the timing when the first pulse of the first dividing period signal 'DIV1' is generated after the second reset signal 'TI_RST' is activated, and can be substantially equal to the values of the multiple dividing signals 'S1' to 'S64' defined in a temperature section of about 100° C., as shown in FIG. 12.

A simulation result at a temperature of about 70° C. is shown in FIG. 15. Values acquired by latching the multiple dividing signals 'S1' to 'S64' is --L/H/L/H/H/L/L-- at the timing when the first pulse of the first dividing period signal 'DIV1' is generated after the second reset signal 'TI_RST' is activated, and correspond to --X/X/X/H/H/L/L--, wherein values of the multiple dividing signals 'S1' to 'S64' are defined in a temperature section of about 55° C. or higher, as shown in FIG. 12.

When values of the temperature codes DTI0 to DTI2 are output to an exterior of the semiconductor integrated circuit through the pads DQ8 to DQ10 as the digital temperature information, a memory controller, such as a Graphic Processing Unit (GPU), can use the digital temperature information for determining auto refresh rates of the semiconductor integrated circuit.

In the temperature sensing section, i.e., the section where the temperature sensing section signal 'A' is activated, the input to the dividing signal latching unit 530 (in FIG. 3) can be intercepted to prevent the input levels of the first decoder 540 and the second decoder 550 from being transitioned and the input to the dividing signal latching unit 530 can be opened only for a predetermined time after temperature sensing is terminated to operate the first decoder 540 and the second decoder 550. In addition, in the temperature sensing section, the input to the temperature code latching unit 560 (in FIG. 3) can be intercepted. By this method, it is possible to prevent false digital temperature information from being output due to a noise component, such as a glitch, that can be included in a digital temperature information generation process due to instant transitioning of an input signal.

Figure 16:
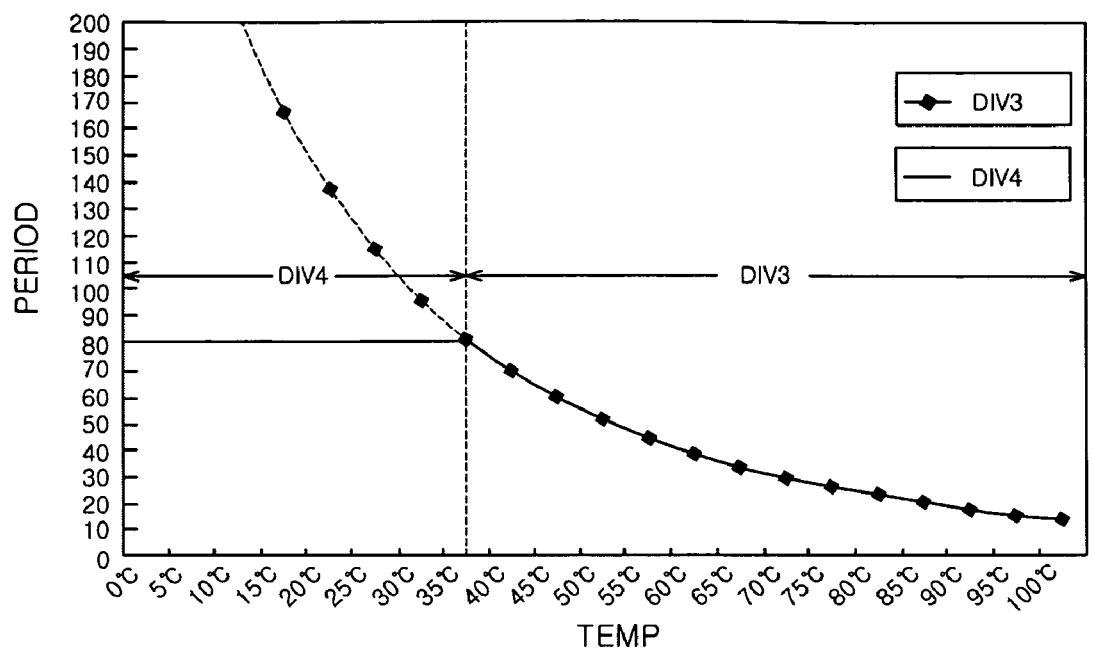
FIG. 16 is a graph illustrating exemplary temperature and period of a self refresh signal according to one embodiment.

FIG. 16 is a graph illustrating exemplary temperature and period of a self refresh signal according to one embodiment. An exemplary operational method of generating the refresh period signal of the refresh period signal generator with the digital temperature information generation function will be described with reference to FIG. 16.

In the operation method, the period of the refresh period signal 'PSRF' is, first of all, prevented from being too extended under a predetermined temperature, for example about 37° C. or lower (generally called room temperature or cold temperature in the semiconductor circuit technology), while the period of the refresh period signal 'PSRF' can be allowed to vary for an efficient self refresh operation under a temperature condition of about 38° C. or higher.

When the temperature is higher than about 37° C., for example, about 90° C., that is, a temperature generally called hot temperature in the semiconductor circuit technology, the operational method will be described.

When the first reset signal 'RST' is generated, the first logic circuit portion 611 (in FIG. 8) can output the comparison signals 'C' and 'D' to a high level and a low level, respectively. The second logic circuit portion 612 (in FIG. 8) can output the pre-control signal 'COLD_EN_PRE' to a low level as the first reset signal 'RST' is generated. The comparison signals 'C' and 'D' can be at a high level and at a low level, respectively, whereby the pre-control signal 'COLD_EN_PRE' of the low level can be latched to the second latch 622 (in FIG. 8) through the first 3-state inverter TSIV31.

As shown in FIG. 16, when the current temperature is about 90° C., the period of the third dividing period signal 'DIV3' can be relatively shorter than the period of the fourth dividing period signal 'DIV4'. For example, the pulse of the third dividing period signal 'DIV3' can be generated earlier than the pulse of the fourth dividing period signal 'DIV4'. Thus, after the first reset signal 'RST' is generated, the second transistor M32 of the first logic circuit portion 611 can be turned ON, whereby the comparison signals 'C' and 'D' can be transitioned to a low level and a high level, respectively. Accordingly, the pre-control signal 'COLD_EN_PRE' of the second logic circuit portion 612 can be latched to the third latch 623 through the second 3-state inverter TSIV32, and the control signals 'COLD_EN' and 'COLD_ENB' can be output to a low level and a high level, respectively. Thus, the period signal selection unit 630 (in FIG. 9) can select and output the third dividing period signal 'DIV3' as the refresh period signal 'PSRF'.

The operational method will now be described under a cold temperature condition in which the temperature is lower than about 37° C., for example, about 30° C.

When the first reset signal 'RST' is generated, the first logic circuit portion 611 (in FIG. 8) can output the comparison signals 'C' and 'D' to a high level and a low level, respectively.

As shown in FIG. 16, when the current temperature is about 30° C., the period of the fourth dividing period signal 'DIV4' can be relatively shorter than the period of the third dividing period signal 'DIV3'. For example, the pulse of the fourth dividing period signal 'DIV4' can be generated earlier than the pulse of the third dividing period signal 'DIV3'. Thus, the fifth transistor M35 of the second logic circuit portion 612 can be turned ON, such that the pre-control signal 'COLD_ EN_PRE' can be transitioned to a high level. The comparison signals 'C' and 'D' are at a high level and a low level, respectively, such that the pre-control signal 'COLD_EN_PRE' of the high level can be latched to the second latch 622 through the first 3-state inverter TSIV31. For example, the pre-control signal 'COLD_EN_PRE' can be transition to a high level and the third transistor M33 can be turned ON after the delay time of the second delay element DLY32 of the first logic circuit portion 611 elapses, whereby the comparison signals 'C' and 'D' can be transition to a low level and a high level, respectively. Accordingly, the pre-control signal 'COLD_EN_PRE' of a high level can be latched to the third latch 623 through the second 3-state inverter TSIV32, and the control signals 'COLD_EN' and 'COLD_ENB' can be output to a high level and a low level, respectively. Thus, the period signal selection unit 630 (in FIG. 9) can select and output the fourth dividing period signal 'DIV4' as the refresh period signal 'PSRF'.

In FIG. 16, the third dividing period signal 'DIV3' and the fourth dividing period signal 'DIV4' can be output as the refresh period signal 'PSRF' under a hot temperature condition (about 37° C. or higher) and a cold temperature condition (equal to or lower than about 37° C.) on the basis of a predetermined temperature (about 37° C.), respectively. Accordingly, the self refresh operation can be efficiently performed by using as the refresh period signal PSRF the third dividing period signal DIV3 of which the period varies according to the temperature under the hot temperature condition and the self refresh operation can be stably performed by preventing the self refresh period from being too extended by using the fourth dividing period signal DIV4 having a fixed period as the refresh period signal PSRF under the cold temperature.

Figure 17:
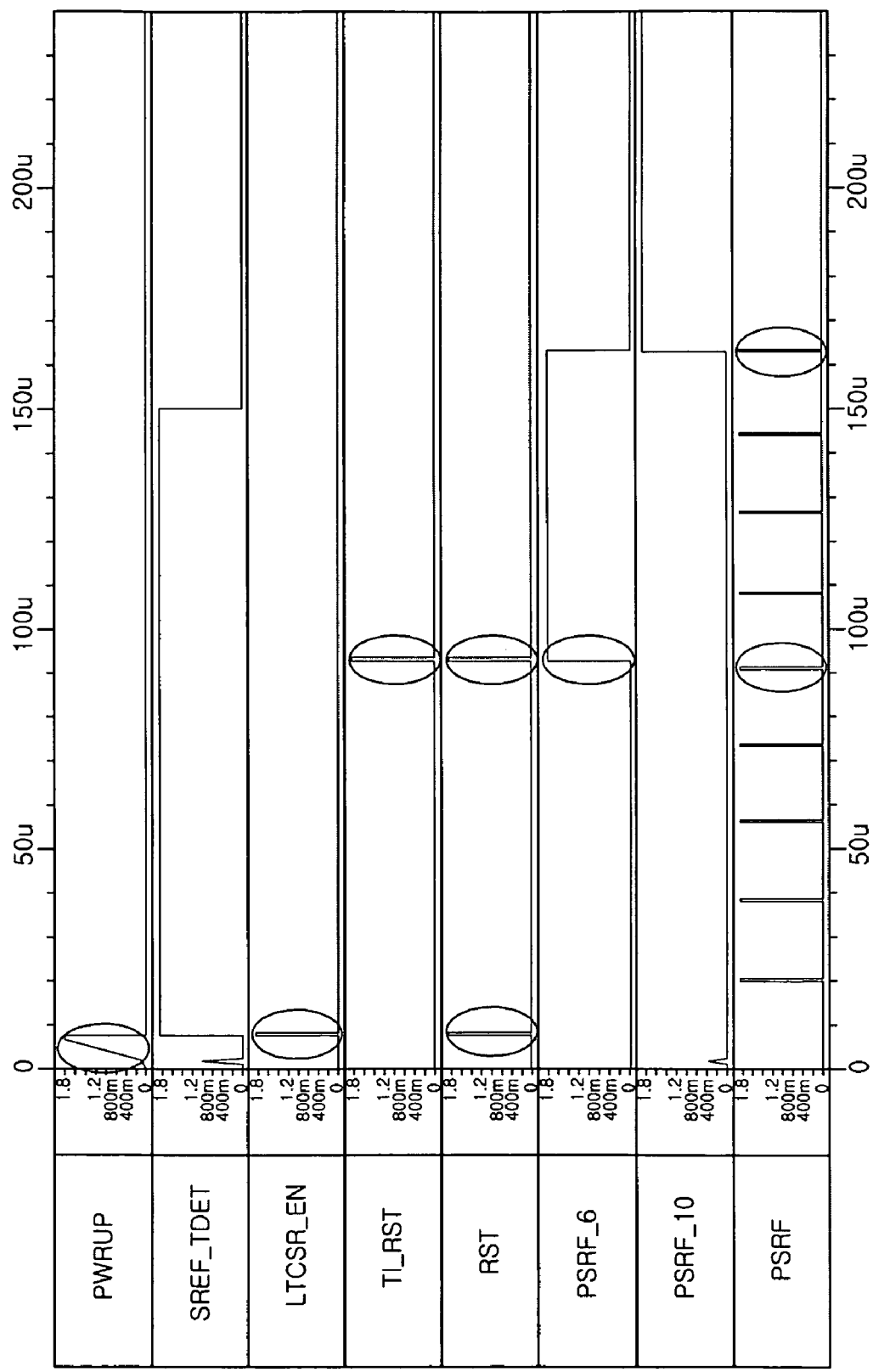
FIGS. 17 and 18 are timing diagrams of an exemplary output signal of the operation timing control part of FIG. 2 according to one embodiment.
Figure 18:
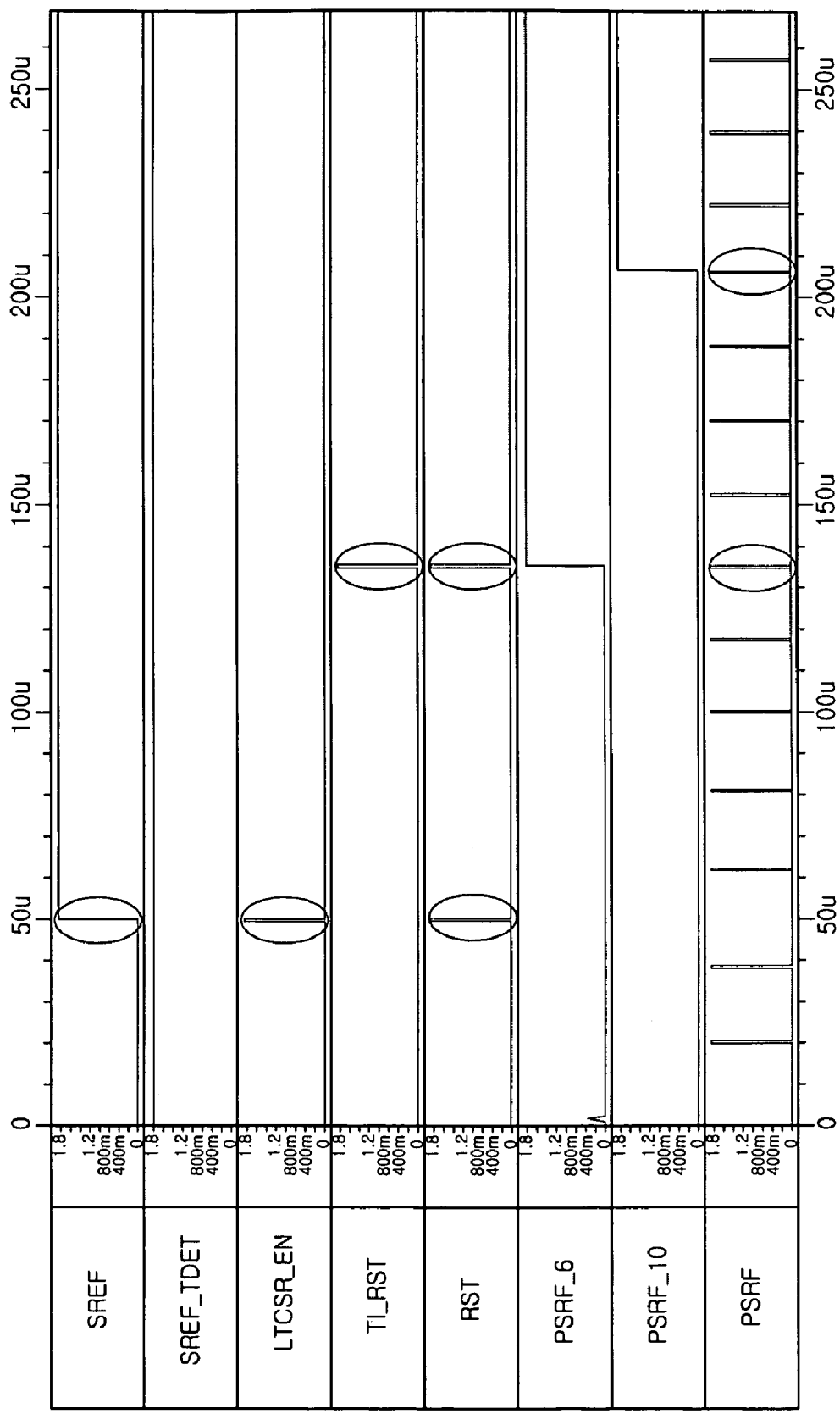

FIGS. 17 and 18 are timing diagrams of an exemplary output signal of the operation timing control part of FIG. 2 according to one embodiment. Specifically, FIG. 17 is a timing diagram of an output signal of the operation timing control part of FIG. 2 in the case when the self refresh signal SREF is not activated, and FIG. 18 is a timing diagram of the output signal of the operation timing control part of FIG. 2 in the case when the self refresh signal SREF is activated.

An exemplary operational method of generating the timing signals, such as the first reset signal 'RST', the second reset signal 'TI_RST', the enable signal 'LTCSR_EN', and the operation section signal 'SERF_TDET', in the operation timing control part 700 will be described.

In FIG. 17, when the self refresh signal 'SREF' is not activated, the operation section signal 'SERF_TDET' can be generated to have an activation section corresponding to a section of from a time when the power-up signal 'PWRUP' is generated to a time when the second shift signal 'PSRF_10' is generated. In addition, the enable signal 'LTCSR_EN' can be generated at a time when the operation section signal 'SERF_TDET' starts to be activated. Moreover, the first reset signal 'RST' can be generated at a time when the power-up signal 'PWRUP' is generated, at a time when the fifth dividing period signal 'DIV5' is generated, or at a time when the first shift signal 'PSRF_6' is generated. Then, the second reset signal 'TI_RST' can be generated at the time when the first shift signal 'PSRF_6' is generated.

Next, when the self refresh signal 'SREF' is activated after the temperature sensing is started, the operation section signal 'SERF_TDET' can maintain a preactivated state, as shown in FIG. 18.

In FIG. 18, the enable signal 'LTCSR_EN' can be generated at the time when the self refresh signal 'SREF' starts to be activated. In addition, the first rest signal 'RST' can be generated at the time when the self refresh signal 'SREF' starts to be activated, at the time when the fifth dividing period signal 'DIV5' is generated, or at the time when the first shift signal 'PSRF_6' is generated. Moreover, the second reset signal 'TI_RST' can be generated at the time when the first shift signal 'PSRF_6' is generated.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A refresh period signal generator with a digital temperature information generation function, comprising:
   a temperature information generating part configured to generate temperature information by using a first period signal and a second period signal;
   a refresh period signal generating part configured to output a refresh period signal by selecting one signal having a shorter period between the first period signal and the second period signal; and
   an operation timing control part operating the temperature information generating part and the refresh period signal generating part at a predetermined timing.

2. The refresh period signal generator according to claim 1, wherein the refresh period signal generating part includes:
   a period comparison unit configured to output a control signal for selecting one of the first period signal and the second period signal by comparing pulse generation timings of the first period signal and the second period signals; and a period signal selection unit configured to select and output one of the first period signal and the second period signal according to the control signal.

3. The refresh period signal generator according to claim 2, wherein the period comparison unit includes:

a first logic circuit portion configured to initialize a comparison signal according to a first reset signal and transition the level of the comparison signal in response to the first period signal and the second period signal by a predetermined time difference; and a second logic circuit portion configured to output one of a first pre-control signal having a level corresponding to the first reset signal and a second pre-control signal having a level corresponding to the second period signal as the control signal according to a transition timing of the comparison signal.

4. The refresh period signal generator according to claim 3, wherein the first logic circuit portion includes:

a first switching element configured to initialize the comparison signal in response to the first reset signal by a time difference equal to a first set time;

a second switching element configured to transition the level of the initialized comparison signal in response to the first period signal; and a third switching element configured to transition the level of the initialized comparison signal in response to the second period signal by a time different equal to a second set time.

5. The refresh period signal generator according to claim 3, wherein the second logic circuit portion includes:

a first switching element configured to initialize the first pre-control signal in response to the first reset signal;

a second switching element configured to transition the level of the second pre-control signal in response to the second period signal;

a third switching element passing one of the first and second pre-control signals in response to the initialized comparison signal; and a fourth switching element outputting an output of the third switching element as the control signal by passing the output of the third switching element when the level of the comparison signal is transitioned.

6. The refresh period signal generator according to claim 2, wherein the period signal selection unit includes:

a first switching element passing the second period signal in response to the control signal; and a second switching element passing the first period signal in response to the control signal.

7. The refresh period signal generator according to claim 1, wherein the temperature information generating part includes:

an output control unit configured to generate a first transmission control signal and a second transmission control signal according to a pulse generation timing of the first period signal;

a multiple dividing signal generating unit generating multiple dividing signals by using the second period signal;

a dividing signal latching unit latching the multiple dividing signals according to the first transmission control signal;

a decoding unit outputting a temperature code by decoding the multiple dividing signals latched in the dividing signal latching unit; and a temperature code latching unit latching the temperature code according to the second transmission control signal.

8. The refresh period signal generator according to claim 7, wherein the multiple dividing signal generating unit includes:

a plurality of dividers sequentially dividing the second period signal at dividing ratios to output the divided second period signal.

9. The refresh period signal generator according to claim 8, wherein the dividing ratios of the plurality of dividers are substantially equal to each other.

10. The refresh period signal generator according to claim 7, wherein the output control unit generates the first transmission control signal for allowing the dividing signal latching unit to receive the multiple dividing signals for a first period after a temperature sensing section is terminated and generates the second transmission control signal for disabling the temperature code latching unit to receive an output of the decoding unit for a second period from a time when the temperature sensing section is started to a time when the temperature sensing section is terminated.

11. The refresh period signal generator according to claim 10, wherein the output control unit generates the second transmission control signal for allowing the temperature code latching unit to receive the output of the decoding unit before the time when the temperature sensing section is started.

12. The refresh period signal generator according to claim 10, wherein the second period is more than the first period.

13. The refresh period signal generator according to claim 7, wherein the output control unit includes:

a temperature sensing section signal generating portion configured to generate a temperature sensing section signal for defining the temperature sensing section by using the first period signal, the second period signal, a power-up signal, and a second reset signal;

a first transmission control signal generating portion configured to generate the first transmission control signal by using the temperature sensing section signal; and a second transmission control signal generating portion configured to generate the second transmission control signal by using the temperature sensing section signal.

14. The refresh period signal generator according to claim 13, wherein the temperature sensing section signal generating portion is configured to initialize the temperature sensing section signal in response to the power-up signal, activate the temperature sensing section signal in response to the second reset signal, and deactivate the temperature sensing section signal in response to the first period signal.

15. The refresh period signal generator according to claim 14, wherein the temperature sensing section signal generating portion deactivates the temperature sensing section signal in response to the first period signal or the second period signal.

16. The refresh period signal generator according to claim 13, wherein the temperature sensing section signal generator portion includes:

a first switching element that transits the temperature sensing section signal to an initialization level in response to the power-up signal;

a second switching element that transitions the temperature sensing section signal to an activation level in response to the second reset signal;

a third switching element that transitions the temperature sensing section signal to a deactivation level in response to the first period signal; and a fourth switching element that transitions the temperature sensing section signal to the deactivation level in response to the second period signal.

17. The refresh period signal generator according to claim 13, wherein the first transmission control signal generating portion includes a pulse generating circuit for generating the first transmission control signal having a pulse width for the first period from the time when the temperature sensing section is terminated by using the temperature sensing section signal.

18. The refresh period signal generator according to claim 13, wherein the second transmission control signal generating portion generates the second transmission control signal by mixing the temperature sensing section signal and a signal acquired by delaying the temperature sensing section signal by the second period.

19. The refresh period signal generator according to claim 7, wherein the dividing signal latching unit outputs the multiple dividing signals by receiving the multiple dividing signals when the first transmission control signal is activated, and intercepts the input of the multiple dividing signals and latches the previously inputted multiple dividing signals when the first transmission control signal is deactivated.

20. The refresh period signal generator according to claim 7, wherein the dividing signal latching unit includes:
a first switching element receiving the multiple dividing signals in response to the first transmission control signal; and
a latch latching an output signal of the first switching element in response to the first transmission control signal.

21. The refresh period signal generator according to claim 7, wherein the decoding unit includes:
a first decoder decoding the multiple dividing signals latched in the dividing signal latching unit to a preliminary code for defining a temperature; and
a second decoder decoding the preliminary code into a temperature code which conforms to a semiconductor memory specification.

22. The refresh period signal generator according to claim 7, wherein the temperature code latching unit latches and outputs the temperature code by receiving the temperature code when the second transmission control signal is activated, and intercepts the input of the temperature code and stops a latching operation when the second transmission control signal is deactivated.

23. The refresh period signal generator according to claim 7, wherein the temperature code latching unit includes:
a first switching element receiving the temperature code in response to the second transmission control signal; and
a latch latching the output signal of the first switching element in response to the second transmission control signal.

24. The refresh period signal generator according to claim 1, wherein the operation timing control part is configured to operate the refresh period signal generating part and the temperature information generating part by a predetermined time difference.

25. The refresh period signal generator according to claim 24, wherein the operation timing control part is configured to operate the temperature information generating part a set time after operating the refresh period signal generating part.

26. The refresh period signal generator according to claim 1, further comprising:
a first period signal generating part that generate the first period signal having a period varying according to the temperature;
a second period signal generating part that generates the second period signal having a predetermined period regardless of the temperature; and
a dividing part that divides at least one of an output of the first period signal generating part and an output of the second period signal generating part.

27. The refresh period signal generator according to claim 26, wherein the first period signal generating part includes a Linear Temperature Compensated Self Refresh (LTCSR) oscillator.

28. The refresh period signal generator according to claim 26, wherein the second period signal generating part includes an Extended Mode Register Set (EMRS) oscillator.

29. The refresh period signal generator according to claim 26, wherein the dividing part selectively outputs a plurality of dividing signals acquired by dividing the first period signal and the second period signal at different dividing ratios to the temperature information generating part and the refresh period signal generating part.

30. The refresh period signal generator according to claim 26, wherein the operation timing control part is configured to initialize the first period signal generating part, the second period signal generating part, the dividing part, and the refresh period signal generating part by using the first reset signal at a time, and initialize the temperature information generating part by using the second reset signal after the set time.

31. The refresh period signal generator according to claim 30, wherein the operation timing control part is configured to generate the first reset signal and the second reset signal by using the power-up signal, a self refresh signal, and a refresh period signal.

32. A refresh period signal generator with a digital temperature information generation function, comprising:
a first period signal generating part that generates a first period signal having a period varying according to a temperature;
a second period signal generating part that generates a second period signal having a predetermined period regardless of the temperature;
a dividing part that outputs first to fourth dividing period signals by dividing the first period signal and the second period signal at a plurality of predetermined dividing ratios;
a temperature information generating part that generates temperature information by using the first dividing period signal and the second period signal;
a refresh period signal generating part that outputs a refresh period signal by selecting one signal having a shorter period between the third dividing period signal and the fourth dividing period signal; and
an operation timing control part that operates the temperature information generating part and the refresh period signal generating part at different timings.

33. The refresh period signal generator according to claim 32, wherein the refresh period signal generating part includes:
a period comparison unit configured to output a control signal for selecting one of the third dividing period signal and the fourth dividing period signal by comparing pulse generation timings of the third dividing period signal and the fourth dividing period signal with each other; and
a period signal selection unit configured to select and output one of the third dividing period signal and the fourth dividing period signal according to the control signal.

34. The refresh period signal generator according to claim 32, wherein the temperature information generating part includes:

an output control unit configured generating a first transmission control signal and a second transmission control signal according to a pulse generation timing of the first dividing period signal;

a multiple dividing signal generating unit generating multiple dividing signals by using the second dividing period signal;

a dividing signal latching unit latching the multiple dividing signals according to the first transmission control signal;

a decoding unit outputting a temperature code by decoding the multiple dividing signals latched in the dividing signal latching unit; and a temperature code latching unit latching the temperature code according to the second transmission control signal.

35. The refresh period signal generator according to claim 34, wherein the output control unit:

generates the first transmission control signal for allowing the dividing signal latching unit to receive the multiple dividing signals for a first period from a time when a temperature sensing section is terminated;

generates the second transmission control signal for disabling the temperature code latching unit to receive an output of the decoding unit for a second period from a time when the temperature sensing section is started to a time when the temperature sensing section is terminated; and generates the second transmission control signal for allowing the temperature code latching unit to receive the output of the decoding unit before the temperature sensing section is started.

36. The refresh period signal generator according to claim 34, wherein the dividing signal latching unit outputs the multiple dividing signals by receiving the multiple dividing signals when the first transmission control signal is activated, and intercepts the input of the multiple dividing signals and latches the previously inputted multiple dividing signals when the first transmission control signal is deactivated.

37. The refresh period signal generator according to claim 34, wherein the decoding unit includes:

a first decoder decoding the multiple dividing signals latched in the dividing signal latching unit to a preliminary code for defining the temperature; and a second decoder decoding the preliminary code output from the first decoder to a temperature code which conforms to a semiconductor memory specification.

38. The refresh period signal generator according to claim 34, wherein the temperature code latching unit latches and outputs the temperature code by receiving the temperature code when the second transmission control signal is activated, and intercepts the input of the temperature code and stops a latching operation when the second transmission control signal is deactivated.

39. The refresh period signal generator according to claim 32, wherein the first period signal generating part includes a Linear Temperature Compensated Self Refresh (LTCSR) oscillator.

40. The refresh period signal generator according to claim 32, wherein the second period signal generating part includes an Extended Mode Register Set (EMRS) oscillator.

41. The refresh period signal generator according to claim 32, wherein the operation timing control part is configured to initialize the first period signal generating part, the second period signal generating part, the dividing part, and the refresh period signal generating part at a time, and initialize the temperature information generating part after a set time.

* * * * *